US011025254B1

United States Patent
Manipatruni et al.

(10) Patent No.: US 11,025,254 B1
(45) Date of Patent: Jun. 1, 2021

(54) LINEAR INPUT AND NON-LINEAR OUTPUT THRESHOLD LOGIC GATE

(71) Applicant: Kepler Computing, Inc., San Francisco, CA (US)

(72) Inventors: Sasikanth Manipatruni, Portland, OR (US); Robert Menezes, Portland, OR (US); Yuan-Sheng Fang, San Francisco, CA (US); Rajeev Kumar Dokania, Beaverton, OR (US); Gaurav Thareja, Santa Clara, CA (US); Ramamoorthy Ramesh, Moraga, CA (US); Amrita Mathuriya, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

(21) Appl. No.: 16/796,824

(22) Filed: Feb. 20, 2020

Related U.S. Application Data

(63) Continuation of application No. 16/729,275, filed on Dec. 27, 2019.

(51) Int. Cl.
*H03K 19/00* (2006.01)
*H03K 19/20* (2006.01)
(Continued)

(52) U.S. Cl.
CPC ............ *H03K 19/23* (2013.01); *H01L 28/55* (2013.01); *H03K 19/003* (2013.01); *H03K 19/01* (2013.01); *H03K 19/20* (2013.01)

(58) Field of Classification Search
CPC .. H03K 19/23; H03K 17/6872; H03K 17/164; H03K 17/693; H03K 19/0948; H01L 28/55; G06F 2207/482
See application file for complete search history.

(56) References Cited

U.S. PATENT DOCUMENTS 3,260,863 A    7/1966   Burns et al.
3,524,977 A    8/1970   Wang
(Continued)

FOREIGN PATENT DOCUMENTS

JP    2000156472    6/2000
KR    20160089141    7/2016

OTHER PUBLICATIONS

Non-Final Office Action dated Mar. 27, 2020 for U.S. Appl. No. 16/729,269.
(Continued)

*Primary Examiner* — Vibol Tan
(74) *Attorney, Agent, or Firm* — Green, Howard & Mughal LLP

(57) ABSTRACT

A new class of logic gates are presented that use non-linear polar material. The logic gates include multi-input majority gates and threshold gates. Input signals in the form of analog, digital, or combination of them are driven to first terminals of non-ferroelectric capacitors. The second terminals of the non-ferroelectric capacitors are coupled to form a majority node. Majority function of the input signals occurs on this node. The majority node is then coupled to a first terminal of a capacitor comprising non-linear polar material. The second terminal of the capacitor provides the output of the logic gate, which can be driven by any suitable logic gate such as a buffer, inverter, NAND gate, NOR gate, etc. Any suitable logic or analog circuit can drive the output and inputs of the majority logic gate. As such, the majority gate of various embodiments can be combined with existing transistor technologies.

24 Claims, 21 Drawing Sheets

(51) Int. Cl.
  *H03K 19/23* (2006.01)
  *H01L 49/02* (2006.01)
  *H03K 19/01* (2006.01)
  *H03K 19/003* (2006.01)

(56) References Cited

U.S. PATENT DOCUMENTS

| | | | |
|---|---|---|---|
| 5,381,352 A | 1/1995 | Shou et al. | |
| 5,818,380 A * | 10/1998 | Ito | H03M 1/0602 341/160 |
| 5,835,045 A | 11/1998 | Ogawa et al. | |
| 5,926,057 A | 7/1999 | Ogawa et al. | |
| 5,978,827 A | 11/1999 | Ichikawa | |
| 6,043,675 A | 3/2000 | Miyamoto | |
| 6,198,652 B1 | 3/2001 | Kawakubo et al. | |
| 6,208,282 B1 * | 3/2001 | Miyamoto | G06F 7/5013 341/158 |
| 7,837,110 B1 * | 11/2010 | Hess | G06K 7/084 235/449 |
| 7,897,454 B2 * | 3/2011 | Wang | H01L 23/5223 438/253 |
| 8,247,855 B2 | 8/2012 | Summerfelt | |
| 9,276,040 B1 | 3/2016 | Marshall et al. | |
| 9,324,405 B2 | 4/2016 | Evans, Jr. | |
| 9,697,882 B1 | 7/2017 | Evans, Jr. | |
| 9,858,979 B1 | 1/2018 | Derner et al. | |
| 9,973,329 B2 * | 5/2018 | Hood | H04L 25/4915 |
| 10,217,522 B2 | 2/2019 | Wang et al. | |
| 10,679,782 B2 | 6/2020 | Manipatruni et al. | |
| 2001/0052619 A1 | 12/2001 | Inoue et al. | |
| 2004/0183508 A1 | 9/2004 | Toyoda et al. | |
| 2015/0337983 A1 | 11/2015 | Dolenti et al. | |
| 2017/0337983 A1* | 11/2017 | Wang | H01L 29/66984 |
| 2018/0076815 A1 | 3/2018 | Vigeant et al. | |
| 2019/0074295 A1 | 3/2019 | Schroeder | |
| 2019/0318775 A1 | 10/2019 | Rakshit et al. | |
| 2019/0348098 A1 | 11/2019 | El-Mansouri et al. | |
| 2020/0210233 A1 | 7/2020 | Chen et al. | |

OTHER PUBLICATIONS

Muroga, S., "Threshold Logic and its Applications", New York, Wiley-Interscience. published 1971.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Subbarao, E. "Ferroelectric and antiferroelectric materials", Department of Metallurgical Engineering, Indian Institute of Technology, Kanpur, IN. First published Mar. 15, 2011. Ferroelectrics, 5:1, 267-280.

Fichtner, S. et al., "AlScN: A III-V semiconductor based ferroelectric", Journal of Applied Physics 125, 114103 (2019); https://doi.org/10.1063/1.5084945. 28 pages.

Kepler Logic. Named for Amalie Emmy Noether @ https://en.wikipedia.org/wiki/Emmy_Noether.

Final Office Action dated Jul. 6, 2020 for U.S. Appl. No. 16/729,269.

Non-Final Office Action dated Apr. 22, 2020 for U.S. Appl. No. 16/729,275.

Non-Final Office Action dated Aug. 7, 2020 for U.S. Appl. No. 16/729,275.

Non-Final Office Action dated Aug. 13, 2020 for U.S. Appl. No. 16/797,299.

Notice of Allowance dated Sep. 17, 2020 for U.S. Appl. No. 16/729,269.

Notice of Allowance dated Nov. 3, 2020 for U.S. Appl. No. 16/797,296.

International Search Report & Written Opinion dated Apr. 14, 2021 for U.S. Appl. No. PCT/US2020/066961.

Final Office Action dated Nov. 24, 2020 for U.S. Appl. No. 16/797,299.

Final Office Action dated Nov. 27, 2020 for U.S. Appl. No. 16/729,275.

Notice of Allowance dated Feb. 3, 2021 for U.S. Appl. No. 16/729,275.

Notice of Allowance dated Jan. 29, 2020 for U.S. Appl. No. 16/797,299.

International Search Report & Written Opinion dated Apr. 22, 2021 for PCT Patent Application No. PCT/US2020/066963.

* cited by examiner

LINEAR INPUT AND NON-LINEAR OUTPUT THRESHOLD LOGIC GATE

CLAIM OF PRIORITY

This Application is a Continuation of, and claims priority to, U.S. patent application Ser. No. 16/729,275, filed on Dec. 27, 2019 and titled "LINEAR INPUT AND NON-LINEAR OUTPUT MAJORITY LOGIC GATE," which is incorporated by reference in its entirety for all purposes.

BACKGROUND

Typical logic gates such as AND gate, OR gate, or a logic gate that receives three or more inputs may consist of nine more transistors per logic gate and many interconnects to connect the various transistors. As the number of transistors increases, power consumption also increases. As devices are pushing down the power envelope to save battery power, existing circuit architecture for multi-input logic gates present challenges to the goal of lower power consumption.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
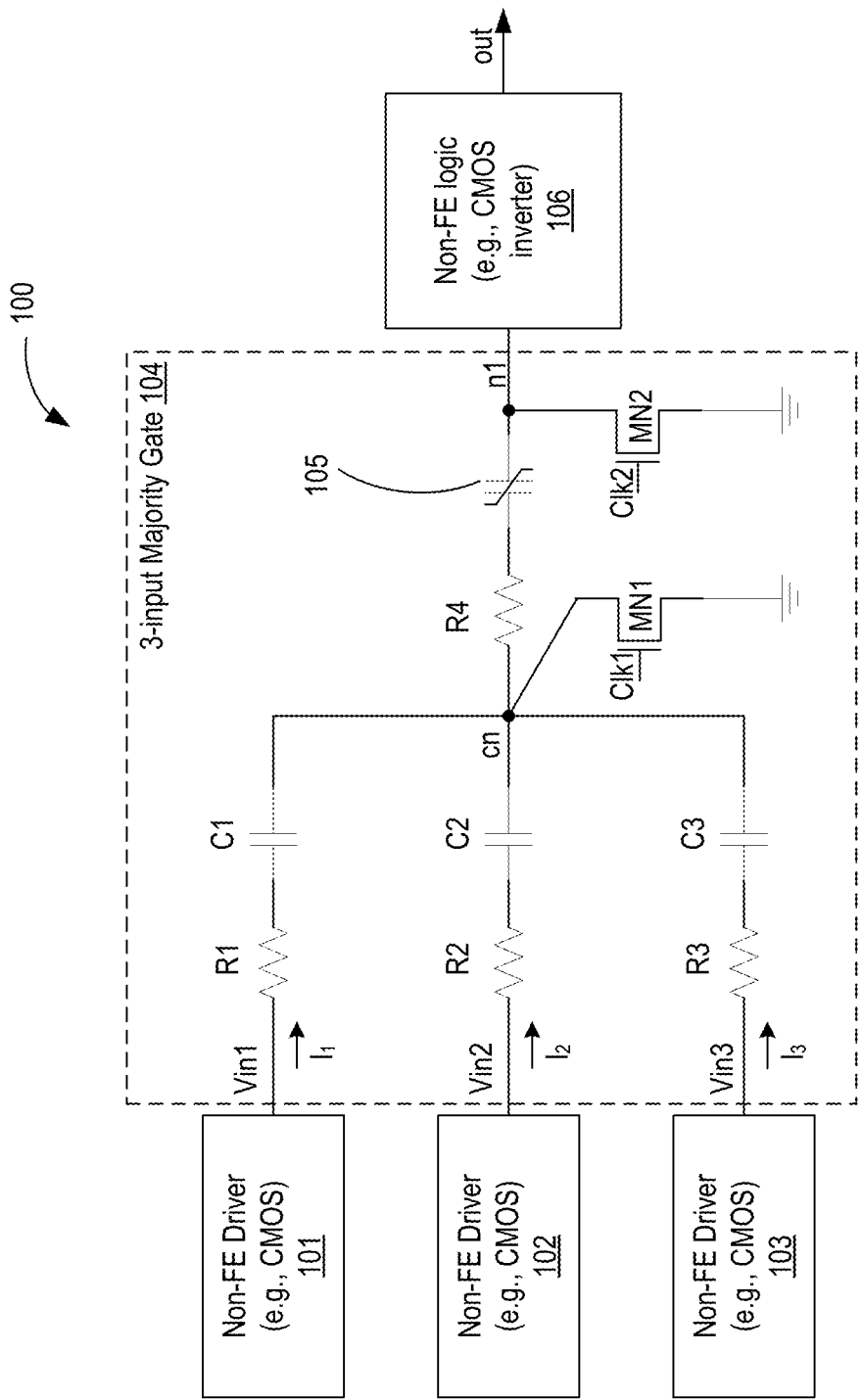
FIG. 1A illustrates a logic gate with a 3-input majority gate, in accordance with some embodiments.

Some embodiments describe a new class of logic gates that use non-linear polar material. The logic gates include multi-input majority gates and threshold gates. Input signals in the form of analog, digital, or combination of them are driven to first terminals of non-ferroelectric capacitors. The second terminals of the non-ferroelectric capacitors are coupled to form a majority node. Majority function of the input signals occurs on this node. The majority node is then coupled to a first terminal of a capacitor comprising non-linear polar material. The second terminal of the capacitor provides the output of the logic gate, which can be driven by any suitable logic gate such as a buffer, inverter, NAND gate, NOR gate, etc. Any suitable logic or analog circuit can drive the output and inputs of the majority logic gate. As such, the majority gate of various embodiments can be combined with existing transistor technologies such as complementary metal oxide semiconductor (CMOS), tunneling field effect transistor (TFET), GaAs based transistors, bipolar junction transistors (BJTs), Bi-CMOS transistors, etc.

In some embodiments, an additional fixed or programmable input is coupled to the majority node via another capacitor. This additional fixed or programmable input can be a positive or negative bias. The bias behaves as a threshold or offset added or subtracted to or from the voltage (or current) on the majority node and determines the final logic value of the logic gate. Depending on the polarity of the bias, AND gate or OR logic gate function are realized, in accordance with various embodiments.

There are many technical effects of the various embodiments. For example, extremely compact basic logic gates are formed using the non-ferroelectric capacitors and a capacitor with non-linear polar material. The non-linear polar material can be ferroelectric material, para-electric material, or non-linear dielectric. The logic gates become the basis of adders, multipliers, sequential circuits, and other complex circuits etc. The majority gate and threshold gate of various embodiments lowers the power consumption because they do not use switching transistors and the interconnect routings are much fewer than the interconnect routings used in transitional CMOS logic gates. For example, 10× fewer interconnect length is used by the majority gate and threshold gate of various embodiments. The capacitor with non-linear polar material provides non-volatility that allows for intermittent operation and zero power drain when not in use.

For example, a processor having such logic gates can enter and exit various types of low power states without having to worry about losing data. Since the capacitor with non-linear polar material can store charge from low energy devices, the entire processor can operate at much lower voltage level from the power supply, which reduces overall power of the processor. Further, very low voltage switching (e.g., 100 mV) of the non-linear polar material state allows for low swing signal switching, which in turn results in low power.

The capacitor with non-linear polar material can be used with any type of transistor. For example, the capacitor with non-linear polar material of various embodiments can be used with planar or non-planar transistors. The transistors can be formed in the frontend or backend of a die. The capacitors with non-linear polar material can be formed in the frontend or backend of the die. As such, the logic gates can be packed with high density compared to traditional logic gates. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1A illustrates logic gate 100 with a 3-input majority gate, in accordance with some embodiments. Logic Gate 100 comprises first, second, and third drivers 101, 102, and 103, respectively. These drivers can be analog drivers generating analog signals or digital drivers generating signals that toggle between ground and the power supply rail, or a combination of analog or digital drivers. For example, driver 101 is a CMOS driver such as a buffer, inverter, a NAND gate, NOR gate, etc., while driver 102 is an amplifier generating a bias signal. The drivers provide input signals Vin1 (and current $I_1$), Vin2 (and current $I_2$), and Vin3 (and current $I_3$) to the three inputs of 3-input majority gate 104.

In various embodiments, 3-input majority gate 104 comprises three input nodes Vin1, Vin2, and Vin3. Here, signal names and node names are interchangeably used. For example, Vin1 refers to node Vin1 or signal Vin1 depending on the context of the sentence. 3-input majority gate 104 further comprises capacitors C1, C2, and C3. Here, resistors R1, R2, and R3 are interconnect parasitic resistances coupled to capacitors C1, C2, and C3 respectively. In various embodiments, capacitors C1, C2, and C3 are non-ferroelectric capacitors. In some embodiments, the non-ferroelectric capacitor includes one of: dielectric capacitor, para-electric capacitor, or non-linear dielectric capacitor.

A dielectric capacitor comprises first and second metal plates with a dielectric between them. Examples of such dielectrics are: HfO, ABO3 perovskites, nitrides, oxy-fluorides, oxides, etc.

A para-electric capacitor comprises first and second metal plates with a para-electric material between them. In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is –0.05, and y is 0.95), HfZrO2, Hf—Si—O, La-substituted PbTiO3, PMN-PT based relaxor ferroelectrics.

A dielectric capacitor comprises first and second metal plates with non-linear dielectric capacitor between them. The range for dielectric constant is 1.2 to 10000. The capacitors C1, C2, and C3 can be implemented as MIM (metal-insulator-metal) capacitor technology, transistor gate capacitor, hybrid of metal capacitors or transistor capacitor.

One terminal of the capacitors C1, C2, and C3 is coupled to a common node cn. This common node is coupled to node n1, which is coupled to a first terminal of a non-linear polar capacitor 105. The majority function is performed at the common node cn, and the resulting voltage is projected on to capacitor 105. For example, the majority function of the currents ($I_1$, $I_2$, and $I_3$) on node cn results in a resultant current that charges capacitor 105. Table 1 illustrates the majority function f(Majority Vin1, Vin2, Vin3).

TABLE 1

| Vin1 | Vin2 | Vin3 | cn (f(Majority Vin1, Vin2, Vin3) |
|------|------|------|----------------------------------|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

Figure 1B:
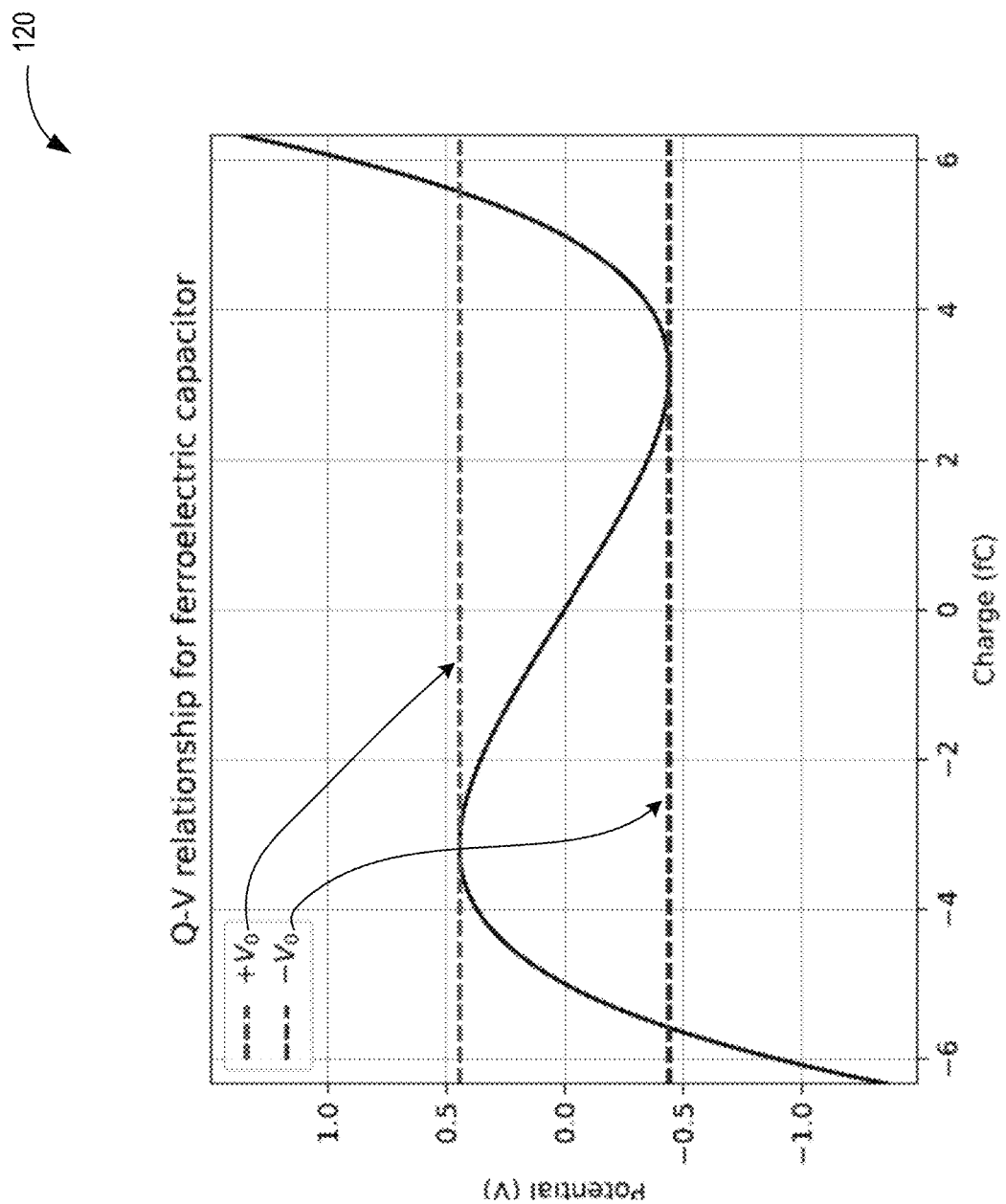
FIG. 1B illustrates a plot showing characteristics of a ferroelectric capacitor.

A capacitor with FE material (also referred to as a FEC) is a non-linear capacitor with its potential $V_F(Q_F)$ as a cubic function of its charge. FIG. 1B illustrates plot 120 showing characteristics of a FEC. Plot 120 is a charge-voltage (Q-V) plot for a block f Pb($Zr_{0.5}Ti_{0.5}$)$O_3$ of area $(100 \text{ nm})^2$ and thickness 20 nm (nanometer). Plot shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

Referring back to FIG. 1A, in some embodiments, N odd number of capacitors are coupled to a single FEC to form a majority gate. In this case, N=3. The measured charge on the FEC ($Q_F$) is the output of the majority gate. Solving for a steady-state solution, the parasitic resistors are ignore and the input potentials $V_i$ (or Vin) are assumed to be constant. In this case, the charge across each linear capacitor (C1, C2, C3) is:

$$Q_i = C_i (V_i - V_F) \quad (1)$$

The charge summed at node Cn and across FEC 105 is express as:

$$Q_F = \Sigma_i Q_i \quad (2)$$

$$Q_F = \Sigma_i C_i V_i - \Sigma_i C_i V_F \quad (3)$$

$$Q_F = \Sigma_i C_i V_i - C V_F (Q_F) \quad (4)$$

$$V_F(Q_F) = \sum_i \frac{C_i}{C} V_i - \frac{Q_F}{C} \quad (5)$$

Here, $C = \Sigma_i C_i$ is the sum of the capacitances. In the limit, $C \to \infty$, the following is achieved:

$$V_F(Q_F) = \sum_i \frac{C_i}{C} V_i = \overline{V} \quad (6)$$

The potential across FEC 105 is the average of all the input potentials weighted by the capacitances (e.g., C1, C2, and C3).

When $C_i = C/N$ are all equal, $V_F$ is just a simple mean. To ensure that $$Q_F = V_F^{-1}(\overline{V}) \quad (7)$$

is well defined, all possible values of $\overline{V}$ have magnitudes greater than $V_c$, the coercive potential. Assuming binary input of $+/-V_s$, the potential with the smallest magnitude is:

$$\overline{V} = V_s / N \quad (8)$$

This occurs when $(N+1)/2$ of the inputs are $+V_s$ and $(N-1)/2$ are $-V_s$. Then, $$V_s > N V_C \quad (9)$$

Figure 1C:
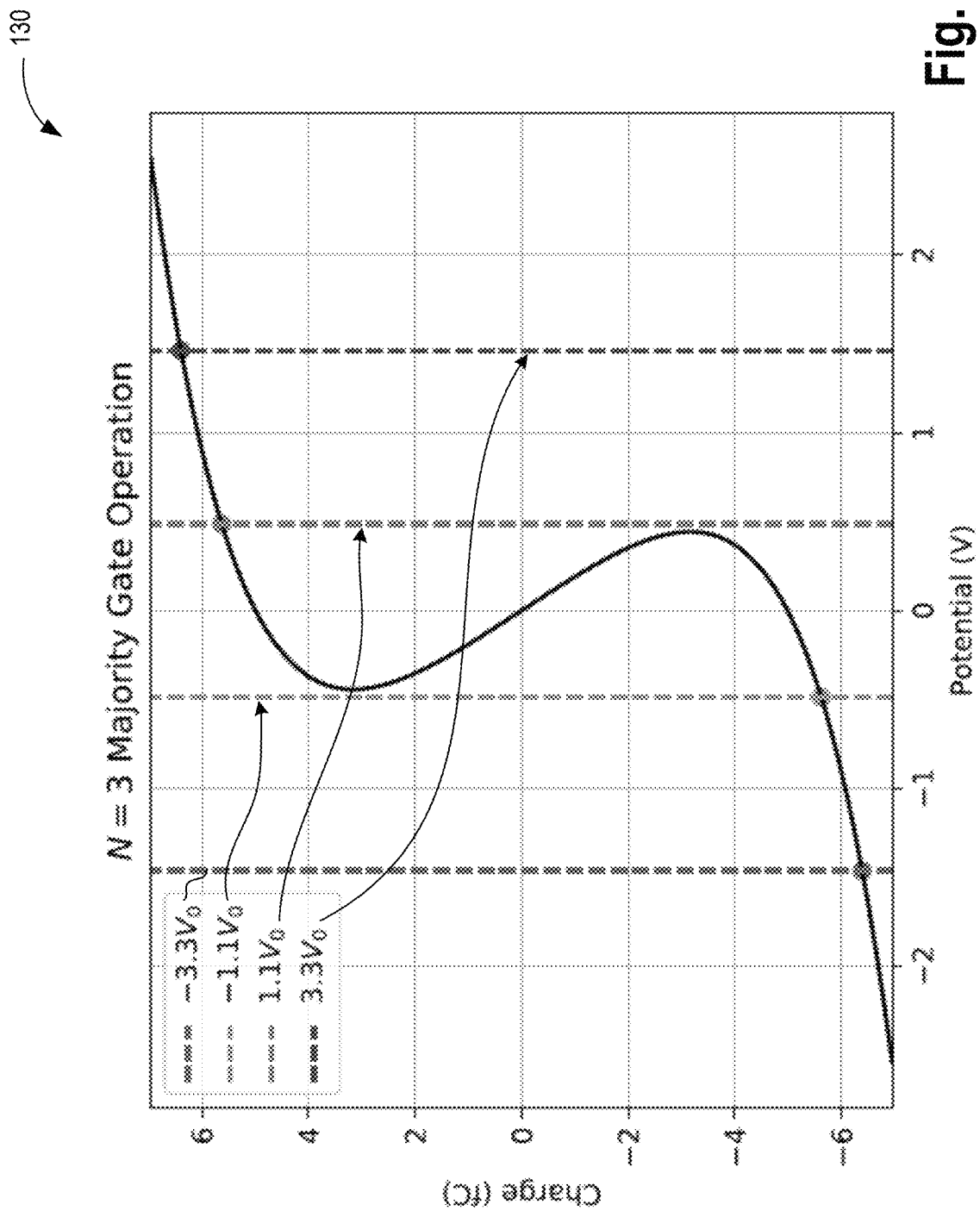
FIG. 1C illustrates plot showing the output of a 3-input majority gate, in accordance with some embodiments.

The output of the majority gate at node n1 is expressed by FIG. 1C. FIG. 1C illustrates plot 130 showing the output of a 3-input majority gate, in accordance with some embodiments.

As an example, for N=3, the possible inputs are:

$$\overline{V} \in \left\{ -\frac{3}{3} V_s, -\frac{1}{3} V_s, +\frac{1}{3} V_s, +\frac{3}{3} V_s \right\} \quad (10)$$

Referring back to FIG. 1A, since capacitor 105 is a non-linear polar capacitor, both of its terminals of the capacitor are pre-discharged to ground or to a known pre-determined voltage via transistors MN1 and MN2. The predetermined voltage can be programmable. The pre-determined voltage can be positive or negative. In some embodiments, p-type transistors are provided to pre-charge both terminals of capacitor 105 to a supply voltage or another predetermined voltage. The predetermined voltage can be programmable. The pre-determined voltage can be positive or negative. In some embodiments, the pre-charge or pre-discharge of the terminals of capacitor 105 (or nodes cn and n1) is done periodically by a clock signal Clk. The control can be a non-clock signal that is generated by a control logic (not shown). For example, the control can be issued every predetermined or programmable time. In some embodiments, both transistors MN1 and MN2 receive the same clock signal (e.g., Clk1). In some embodiments, transistors MN1 receives Clk1 and MN2 received Clk2, where Clk2 is different from Clk1. For example, Clk2 is phase shifted relative to Clk1. In some embodiments, one transistor is used to pre-charge or pre-discharge both terminals of capacitor 105. For example, drain terminal of transistor MN1 is coupled to both terminals of capacitor 105, and transistor MN2 is not used (and removed).

In some embodiments, the non-linear polar material of capacitor 105 includes one of: ferroelectric (FE) material, para-electric material, or non-linear dielectric. In various embodiments, para-electric material is the same as FE material but with chemical doping of the active ferroelectric ion by an ion with no polar distortion. In some cases, the non-polar ions are non-s orbital ions formed with p, d, f external orbitals. In some embodiments, non-linear dielectric are the same as para-electric materials, relaxors, and dipolar glasses.

In some embodiments, f-orbital materials (e.g., lanthanides) are doped to the ferroelectric material to make paraelectric material. Examples of room temperature paraelectric material include: BaTiO3, Ba(x)Sr(y)TiO3 (where x is −0.5, and y is 0.95).

In various embodiments, the FE material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted BiFeO3, BiCrO3, BiCoO3 class of materials, La or rate earth substitution into the Bi site can tune the spontaneous distortion. In some embodiments, the F materials include: SrTiO3, Ba(x)Sr(y)TiO3 (where x is −0.05, and y is 0.95), HfZrO2, Hf—Si—O, La-substituted PbTiO3, PMN-PT based relaxor ferroelectrics.

In some embodiments, the FE material comprises a stack of layers including low voltage FE material between (or sandwiched between) conductive oxides. In various embodiments, when FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides adjacent to the FE material are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: Hafnium (Hf), Zirconium (Zr), Aluminum (Al), Silicon (Si), their oxides or their alloyed oxides. In some embodiments, FE material includes one of: Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material includes Bismuth ferrite (BFO), lead zirconate titanate (PZT), BFO with doping material, or PZT with doping material, wherein the doping material is one of Nb or La; and relaxor FE such as PMN-PT.

In some embodiments, the FE material includes Bismuth ferrite (BFO), BFO with a doping material where in the doping material is one of Lanthanum, or any element from the lanthanide series of the periodic table. In some embodiments, the FE material includes lead zirconium titanate (PZT), or PZT with a doping material, wherein the doping material is one of La, Nb. In some embodiments, the FE material includes a relaxor ferroelectric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST).

In some embodiments, the FE material includes Hafnium oxides of the form, Hf1−x Ex Oy where E can be Al, Ca, Ce, Dy, er, Gd, Ge, La, Sc, Si, Sr, Sn, or Y. In some embodiments, the FE material includes Niobate type compounds LiNbO3, LiTaO3, Lithium iron Tantalum Oxy Fluoride, Barium Strontium Niobate, Sodium Barium Niobate, or Potassium strontium niobate.

Threshold in the FE material has a highly non-linear transfer function in the polarization vs. voltage response. The threshold is related a) to non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create a S-shaped loop. The shape can be systematically tuned to ultimately yield a non-linear dielectric. The squareness of the FE switching can also be changed by the granularity of the FE layer. A perfectly epitaxial, single crystalline FE layer will show higher squareness (e.g., ratio is closer to 1) compared to a poly crystalline FE. This perfectly epitaxial can be accomplished by the use of lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, Polyvinylidene fluoride or polyvinylidene difluoride (PVDF).

The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include Indium Tin Oxide (ITO) such as Sn-doped In2O3.

The charge developed on node n1 produces a voltage and current that is the output of the majority gate 104. Any suitable driver 106 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, etc. In various embodiments, majority gate 104 coupled to inverter 106 forms a minority gate (majority-invert), resulting in a universal logic gate.

While FIG. 1A illustrates a 3-input majority gate, the same concept can be extended to more than three inputs to make an N-input majority gate, where N is greater than two.

Figure 2A:
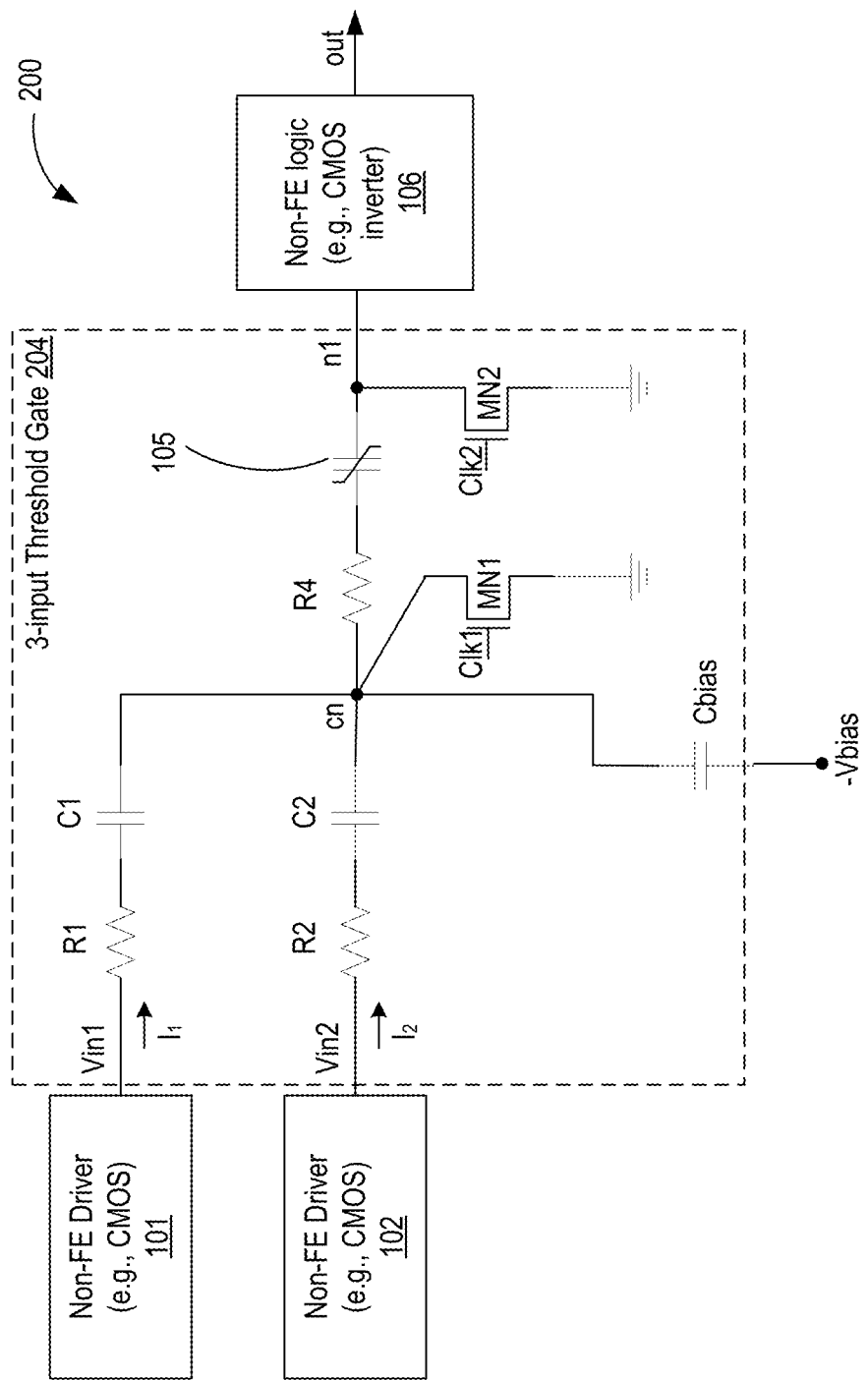
FIG. 2A illustrates a logic gate with a 3-input threshold gate which can operate as a AND or OR gate, in accordance with some embodiments.

FIG. 2A illustrates logic gate 200 with a 3-input threshold gate 204 which can operate as a AND or OR gate, in accordance with some embodiments. Logic gate is similar to logic gate 100 but for removing the third input Vin and adding an input Vbias. This additional input bias makes the logic gate a threshold gate 204. Threshold gate 204 is referred to as a 3-input threshold gate 204 because of the three inputs Vin1, Vin2, and Vbias. It can also be referred to as 2-input threshold gate if the Vbias input is not counted as a separate input. In various embodiments, threshold gate 204 comprises an additional capacitor Cbias that has one terminal coupled to node cn and another terminal coupled to Vbias. The material for capacitor Cbias can be the same as the material for capacitors C1, C2, and C3. For example, capacitor Cbias comprises non-ferroelectric material.

Vbias can be positive or negative voltage depending on the desired logic function of threshold gate 204. Any suitable source can generate Vbias. For example, a bandgap reference generator, a voltage divider such as a resistor divider, a digital to analog converter (DAC), etc. can generate Vbias. Vbias can be fixed or programmable (or adjustable). For example, Vbias can be adjusted by hardware (e.g., fuses, register), or software (e.g., operating system). In some embodiments, when Vbias is positive, the majority function on node cn is an OR function. For example, the function at node cn is OR(Vin1, Vin2, 0). In some embodiments, when Vbias is negative, the majority function on node cn is an AND function. For example, the function at node cn is AND(Vin1, Vin2, 1). Table 2 and Table 3 summarizes the function of threshold gate 204.

TABLE 2

| Vin1 | Vin2 | Vbias | cn OR(Vin1, Vin2, Vbias) |
|------|------|----------|---|
| 0 | 0 | positive | 0 |
| 0 | 1 | positive | 1 |
| 1 | 0 | positive | 1 |
| 1 | 1 | positive | 1 |

TABLE 3

| Vin1 | Vin2 | Vbias | cn AND(Vin1, Vin2, Vbias) |
|------|------|----------|---|
| 0 | 0 | negative | 0 |
| 0 | 1 | negative | 0 |
| 1 | 0 | negative | 0 |
| 1 | 1 | negative | 1 |

Compared to transitional CMOS AND logic gate and OR logic gate, here the AND function and OR function are performed by a network of capacitors. The output of the majority or threshold function on node cn is then stored in the non-linear polar capacitor 105. This capacitor provides the final state of the logic in a non-volatile form. As such, the logic gate of various embodiments describes a non-volatile multi-input AND or OR gate with one or two transistors for pre-discharging or pre-charging nodes cn and n1. The silicon area of the AND or OR gates of various embodiments is orders of magnitude smaller than traditional AND or OR gates. While FIG. 2A illustrates a 3-input threshold gate, the same concept can be extended to more than 3 inputs to make an N-input threshold gate, where N is greater than 2 and an odd number.

Figure 2B:
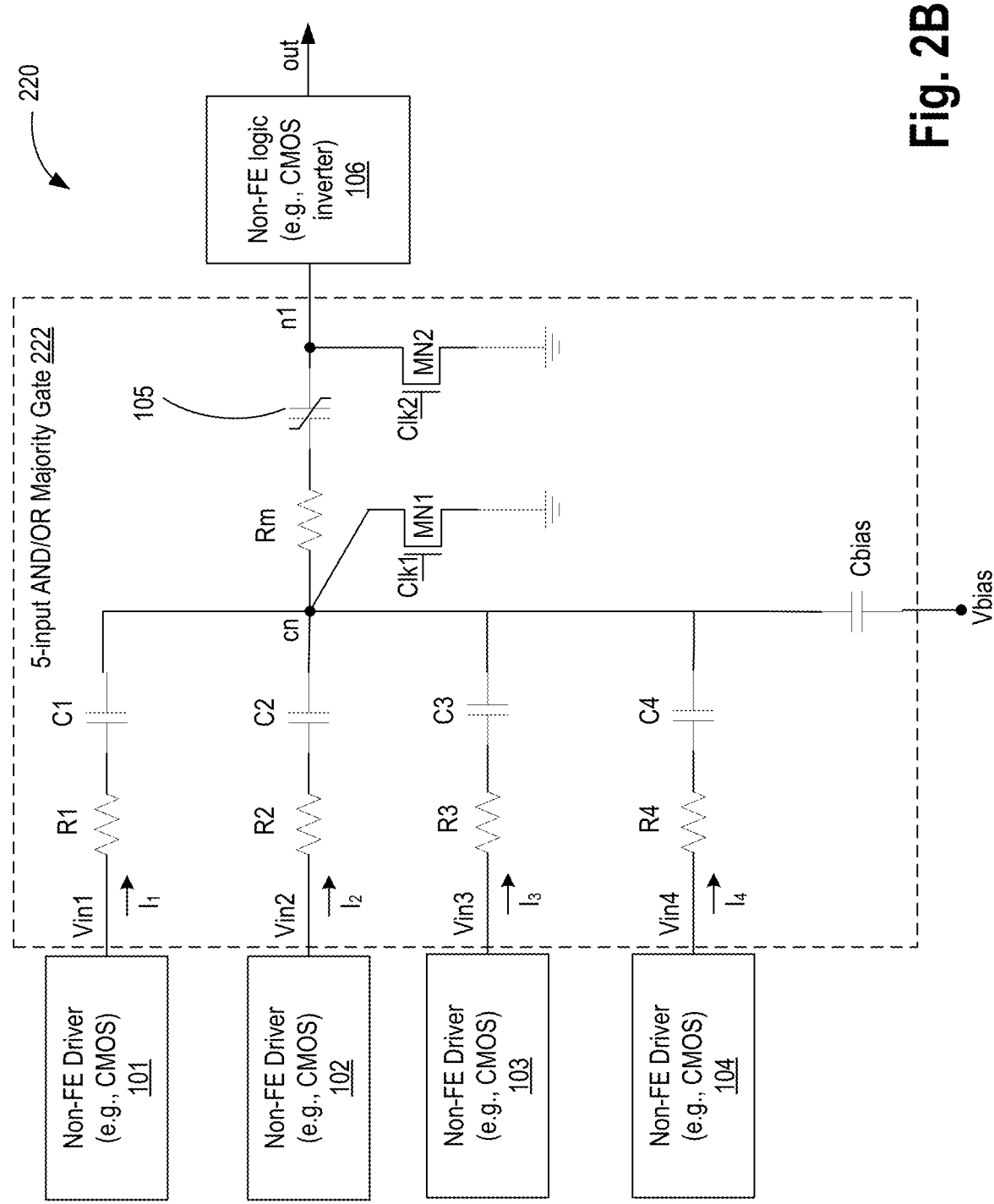
FIG. 2B illustrates a logic gate with a 5-input majority gate which can operate as a AND or OR gate with majority function, in accordance with some embodiments.

FIG. 2B illustrates logic gate 220 with a 5-input AND/OR majority gate 222 which can operate as a AND or OR gate with majority function, in accordance with some embodiments. For purposes of explaining the 5-input AND/OR majority gate 222, consider the capacitances to be Cbias=C3=C4=C/2, C1=C, and C2=C with corresponding input potentials: Vbias=$V_B$, Vin3=$V_A$, Vin4=$V_B$, Vin1=$V_C$, and Vin2=$V_S$, where $V_B$=−$V_o$ is a constant bias voltage and the rest are binary input voltages of +/−$V_o$ for some yet to be determined $V_o$. Gate 222 has a function of (A AND B, C, S). Here, the AND gate function is absorbed into the majority gate at the cost of a bias voltage.

If both $V_S$=$V_C$=+$V_o$, then regardless of $V_A$,$V_B$, it is desired that the output is greater than $V_c$ in magnitude, the coercive voltage. For $V_A$=$V_B$=−$V_o$, the average potential is expressed as:

$$V_F = \frac{C.2V_o - C/2.2V_o - V_o.C/2}{3.5C} \quad (11)$$

-continued $$V_F = \frac{1}{7}V_o > V_c.4 \quad (12)$$

If $V_A$=$V_B$=+$V_0$ and $V_C$=$V_d$=−$V_o$, the following is achieved:

$$V_F = \frac{-C.2V_o + C/2.2V_o - V_o.C/2}{3.5C} \quad (13)$$

$$V_F = -\frac{1}{7}V_o < -V_c.4 \quad (14)$$

To check the equivalence to an AND operation, consider $V_A$=−$V_B$=$V_o$, then $$V_F = \frac{V_A + V_B - V_o}{3.5C} \quad (15)$$

$$V \in \left\{-\frac{3}{7}V_o, -\frac{1}{7}V_o, \frac{1}{7}V_o\right\} \quad (16)$$

As designed, merely when $V_A$=$V_B$=+$V_O$, gate 222 produces a positive output. It is further observed that all outputs are greater than $V_C$ by setting $V_o$>7$V_c$, in accordance with some embodiments.

Here, AND function is performed between Vin3 and Vin4, and the resulting output is used to perform majority function with Vin1 and Vin2, which is described as: Majority (Vin3 AND Vin4, Vin1, Vin2). Table 4 illustrates the truth table of AND majority gate 222.

TABLE 4

| | | AND Function | | | cn AND(Vin1, Vin2, Vin3, Vin4, Vbias) |
|---|---|---|---|---|---|
| Vin1 | Vin2 | Vin3 | Vin4 | Vbias | |
| 0 | 0 | 0 | 0 | negative | 0 |
| 0 | 0 | 0 | 1 | negative | 0 |
| 0 | 0 | 1 | 0 | negative | 0 |
| 0 | 0 | 1 | 1 | negative | 0 |
| 0 | 1 | 0 | 0 | negative | 0 |
| 0 | 1 | 0 | 1 | negative | 0 |
| 0 | 1 | 1 | 0 | negative | 0 |
| 0 | 1 | 1 | 1 | negative | 1 |
| 1 | 0 | 0 | 0 | negative | 0 |
| 1 | 0 | 0 | 1 | negative | 0 |
| 1 | 0 | 1 | 0 | negative | 0 |
| 1 | 0 | 1 | 1 | negative | 1 |
| 1 | 1 | 0 | 0 | negative | 1 |
| 1 | 1 | 0 | 1 | negative | 1 |
| 1 | 1 | 1 | 0 | negative | 1 |
| 1 | 1 | 1 | 1 | negative | 1 |

In the OR majority function case, OR function is performed between Vin3 and Vin4, and the resulting output is used to perform majority function with Vin1 and Vin2, which is describe as: Majority (Vin3 OR Vin4, Vin1, Vin2). Table 5 illustrates the truth table of OR majority gate 222.

TABLE 5

| Vin1 | Vin2 | Vin3 | Vin4 | Vbias | OR Function cn OR(Vin1, Vin2, Vin3, Vin4, Vbias) |
|---|---|---|---|---|---|
| 0 | 0 | 0 | 0 | positive | 0 |
| 0 | 0 | 0 | 1 | positive | 0 |
| 0 | 0 | 1 | 0 | positive | 0 |
| 0 | 0 | 1 | 1 | positive | 0 |
| 0 | 1 | 0 | 0 | positive | 0 |
| 0 | 1 | 0 | 1 | positive | 1 |
| 0 | 1 | 1 | 0 | positive | 1 |
| 0 | 1 | 1 | 1 | positive | 1 |
| 1 | 0 | 0 | 0 | positive | 0 |
| 1 | 0 | 0 | 1 | positive | 1 |
| 1 | 0 | 1 | 0 | positive | 1 |
| 1 | 0 | 1 | 1 | positive | 1 |
| 1 | 1 | 0 | 0 | positive | 1 |
| 1 | 1 | 0 | 1 | positive | 1 |
| 1 | 1 | 1 | 0 | positive | 1 |
| 1 | 1 | 1 | 1 | positive | 1 |

Logic gate 222 can perform AND majority and OR majority functions depending on the bias value for Vbias. Here, merely two transistors (MN1 and MN2) that can be condensed to a single transistor for pre-charging or pre-discharging nodes cn and n1, are used while a complex function of AND majority and OR majority are realized.

In various embodiments, majority gate 222 coupled to inverter 106 forms a minority threshold gate (majority-invert threshold), resulting in a universal logic gate.

Figure 3A:
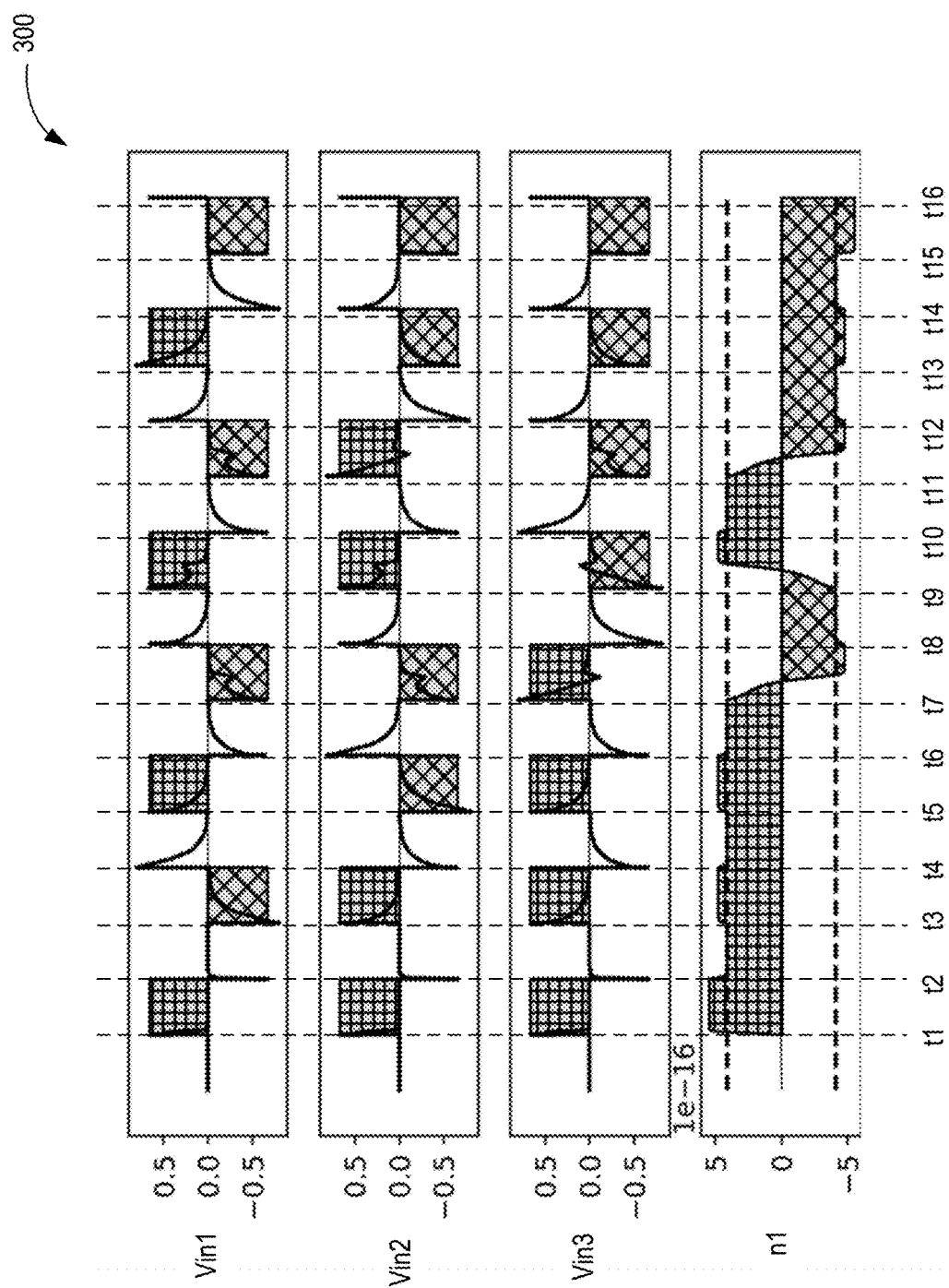
FIG. 3A illustrates waveforms showing operation of 3-input majority gate of FIG. 1B.
Figure 3B:
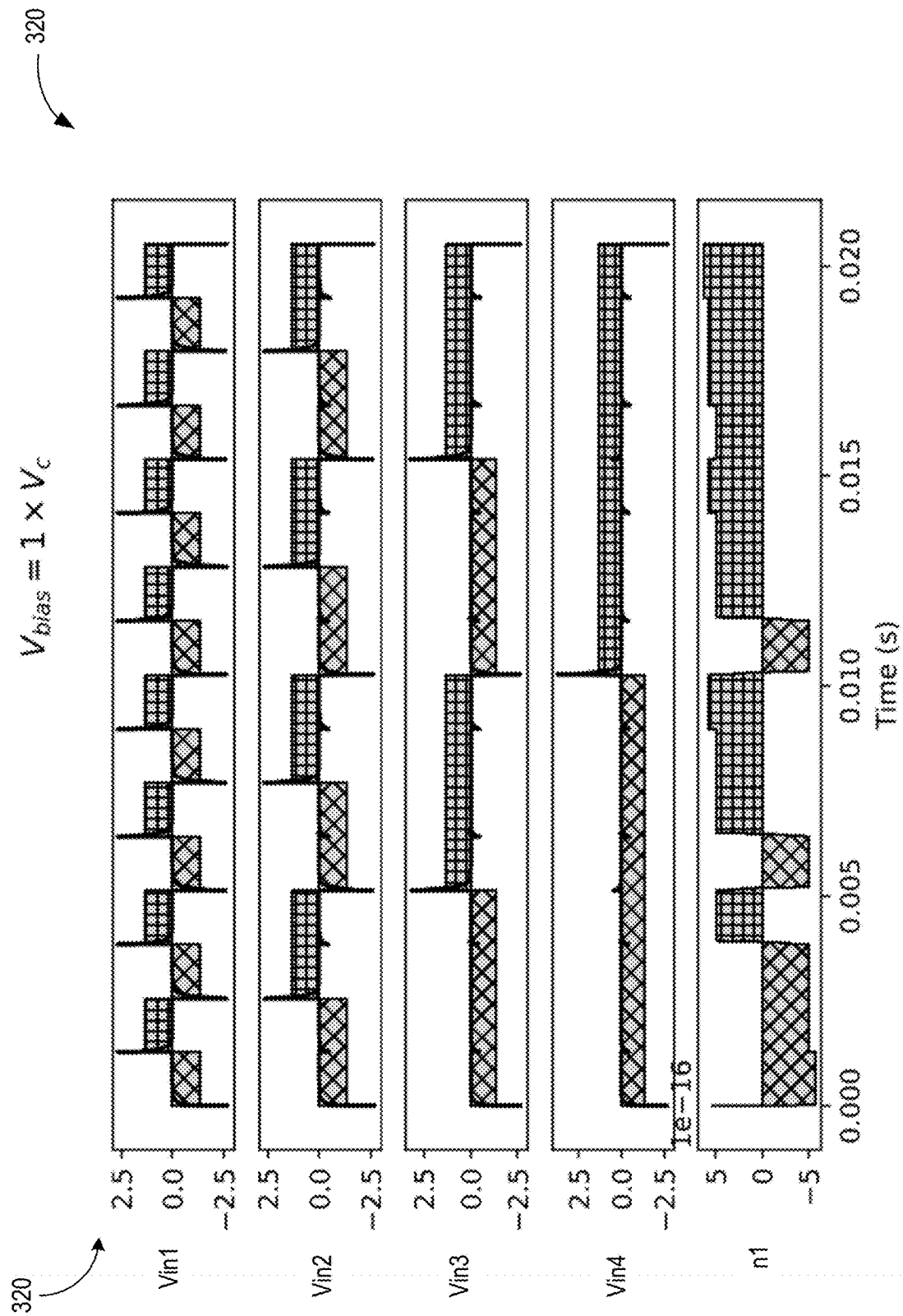
FIG. 3B-E illustrates top down layout and corresponding cross-section of a 3-input majority gate, respectively, in accordance with some embodiments.
Figure 3C:
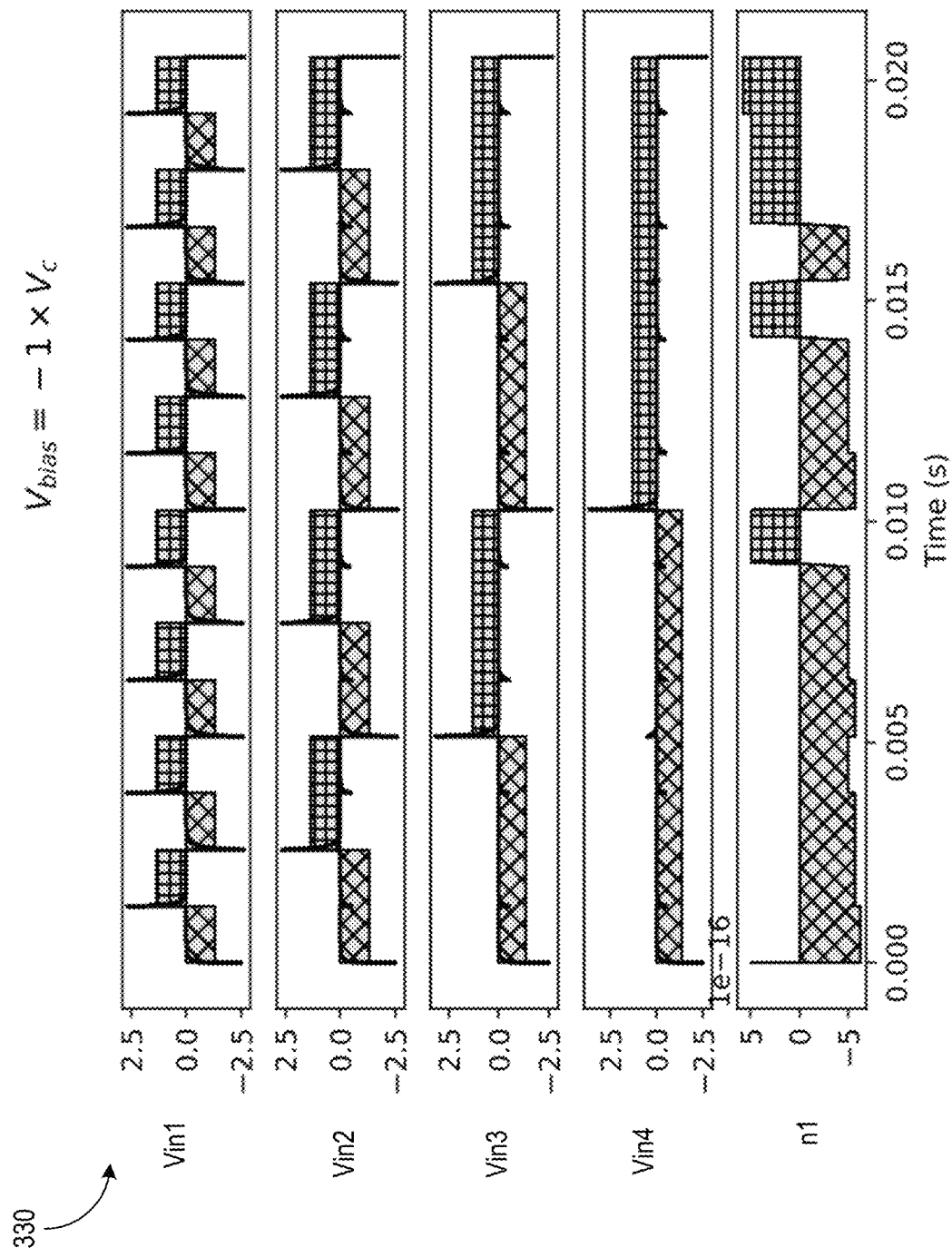
Figure 3D:
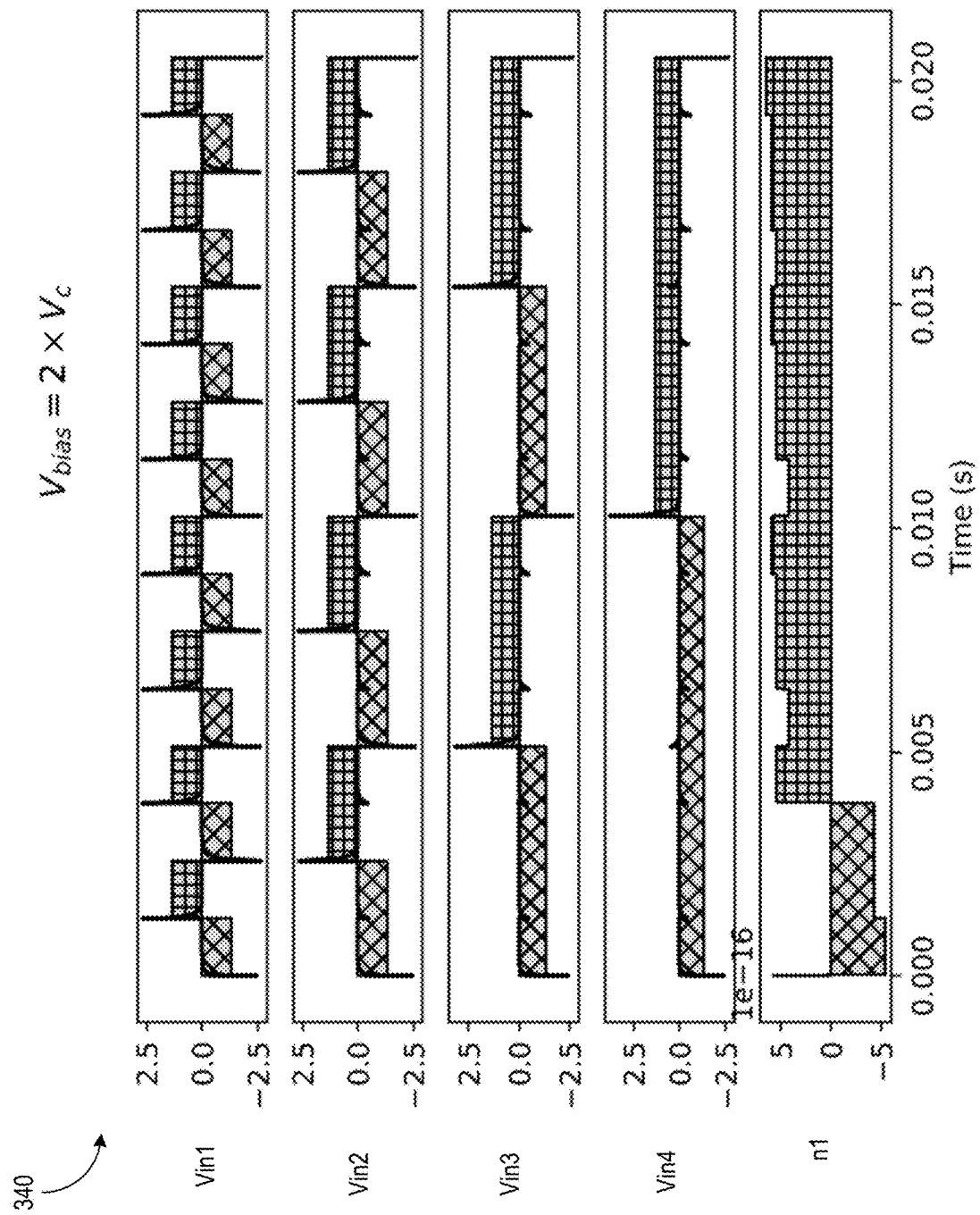
Figure 3E:
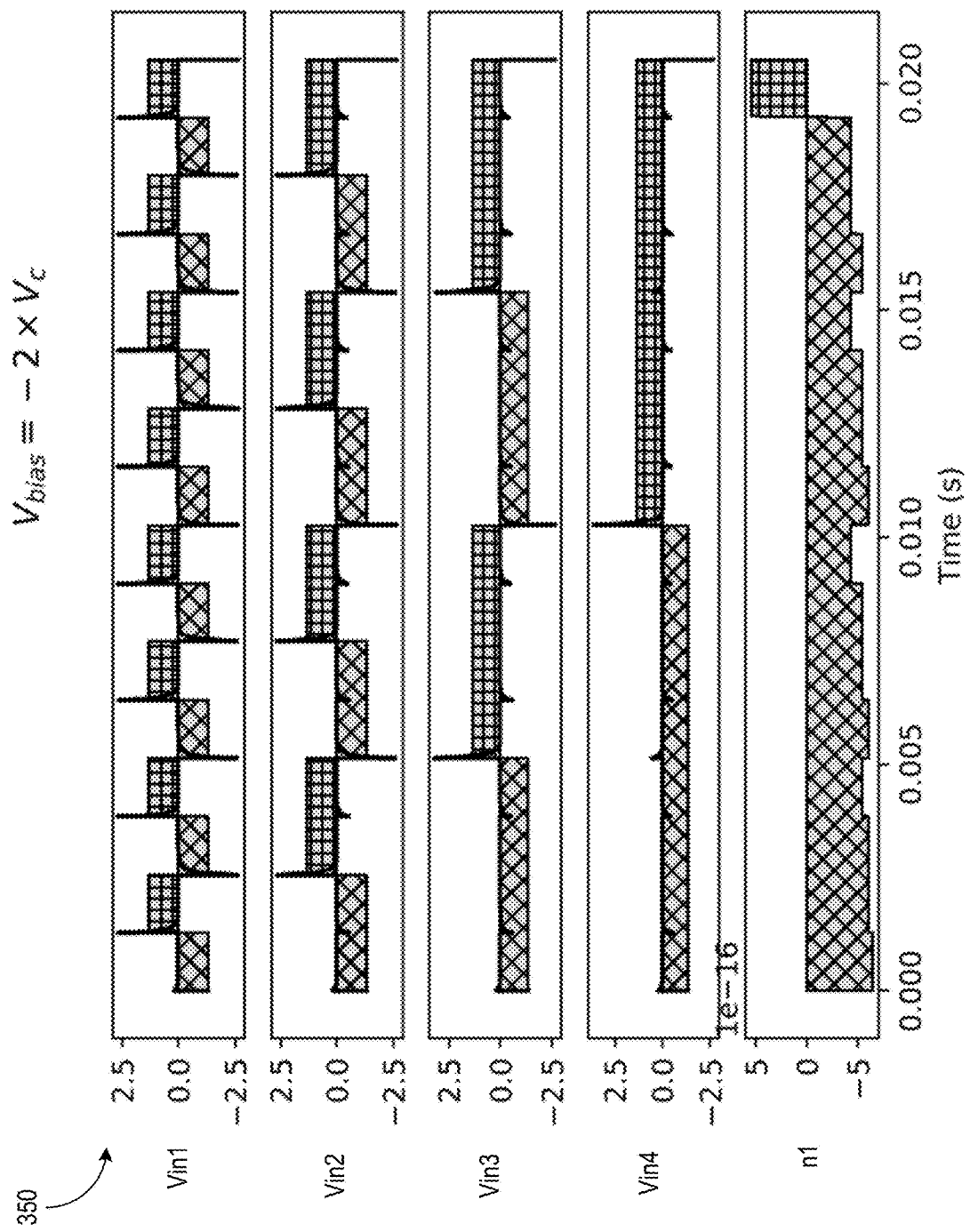

FIG. 3A illustrates waveforms 300 showing operation of 3-input majority gate of FIG. 1B, respectively, in accordance with some embodiments. FIG. 3A illustrates a majority function of inputs Vin1, Vin2, and Vin3.

FIGS. 3B-E illustrate waveforms 320, 330, 340, and 350 showing operation of 5-input threshold gate with different Vbias values, respectively, in accordance with some embodiments.

Figure 4A:
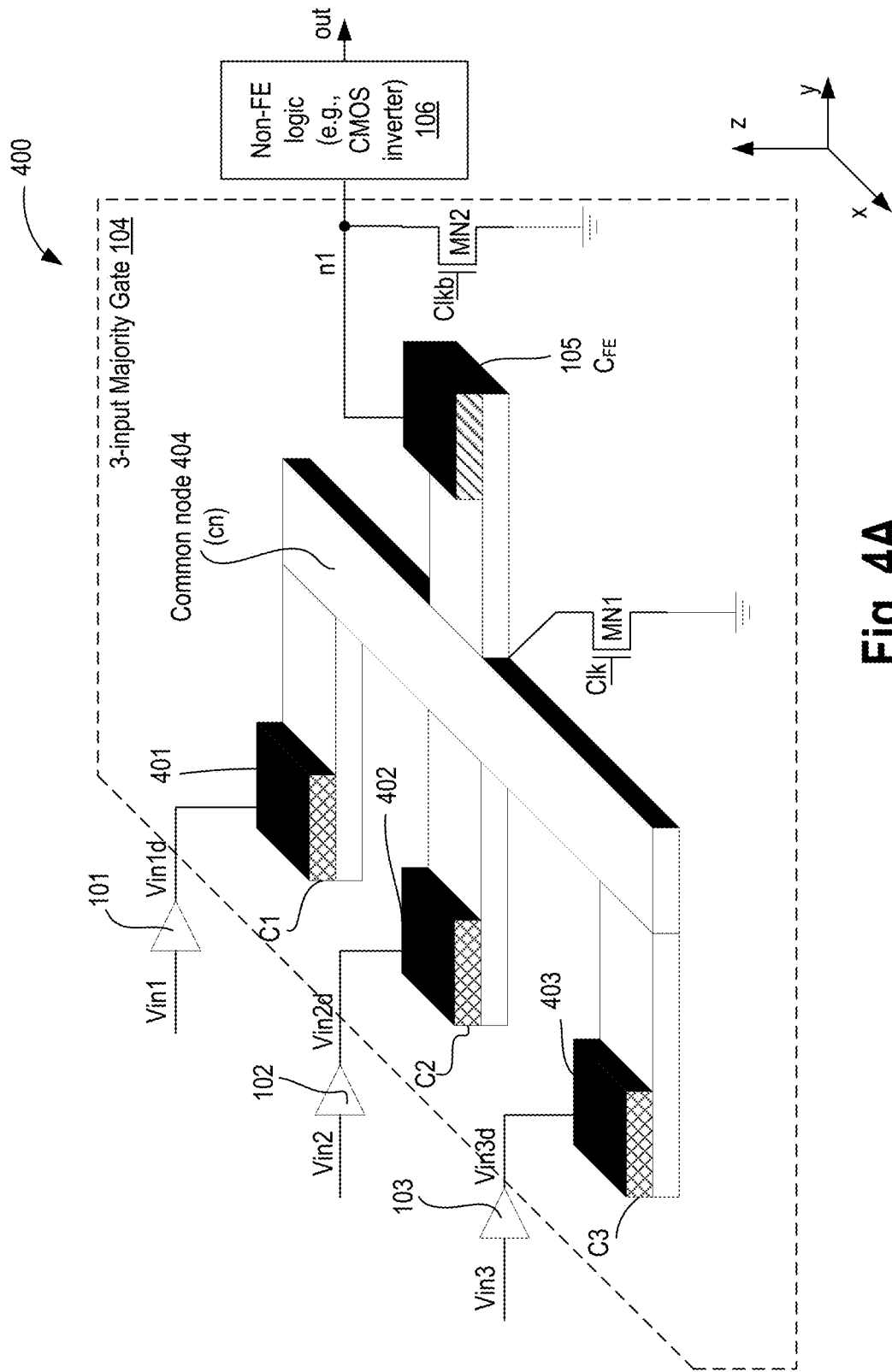
FIG. 4A illustrates combinational logic including the logic gate of FIG. 1B with a 3D (three-dimensional) view of a 3-input majority gate that couples to an inverter or buffer, in accordance with some embodiments.

FIG. 4A illustrates combination logic 400 which includes logic gate of FIG. 1B with a 3D (three-dimensional) view of the 3-input majority gate that couples to an inverter or buffer, in accordance with some embodiments. In this example, capacitors C1 (401), C2 (402), and C3 (403) are MIM capacitors that receive inputs Vin1, Vin2, and Vin3, respectively, on their first terminals from buffers or drivers 101, 102, and 103, respectively. However, other types of capacitors can be used. For example, hybrid of metal and transistor can be used to implement the capacitor. The second terminals of capacitors C1 (401), C2 (402), and C3 (403) are coupled to common node interconnect 404. The output of drivers 101, 102, and 103 are Vin1d, Vin2d, and Vin3d, respectively. Interconnect 404 can be on any suitable metal layer. In some embodiments, interconnect 404 comprises a material which includes one or more of: Cu, Al, Ag, Au, Co, or W. In some embodiments, capacitors C1 (401), C2 (402), and C3 (403) are formed in the backend of the die. In some embodiments, capacitors C1 (401), C2 (402), and C3 (403) are formed in the frontend of the die. Interconnect 404 is coupled to a first terminal of non-linear polar capacitor 105. In this example, capacitor 105 comprises ferroelectric material and hence labeled as $C_{FE}$. However, other non-linear polar material described herein can be used to fabricate capacitor 105. The second terminal of capacitor 105 is coupled to node n1.

In some embodiments, capacitor 105 is a pillar capacitor. A pillar capacitor is taller than its width and allows for compact layout in the z-direction. In one embodiment, capacitors C1 (401), C2 (402), and C3 (403) are fabricated below or under pillar capacitor forming a vertical majority gate 104.

Figure 4B:
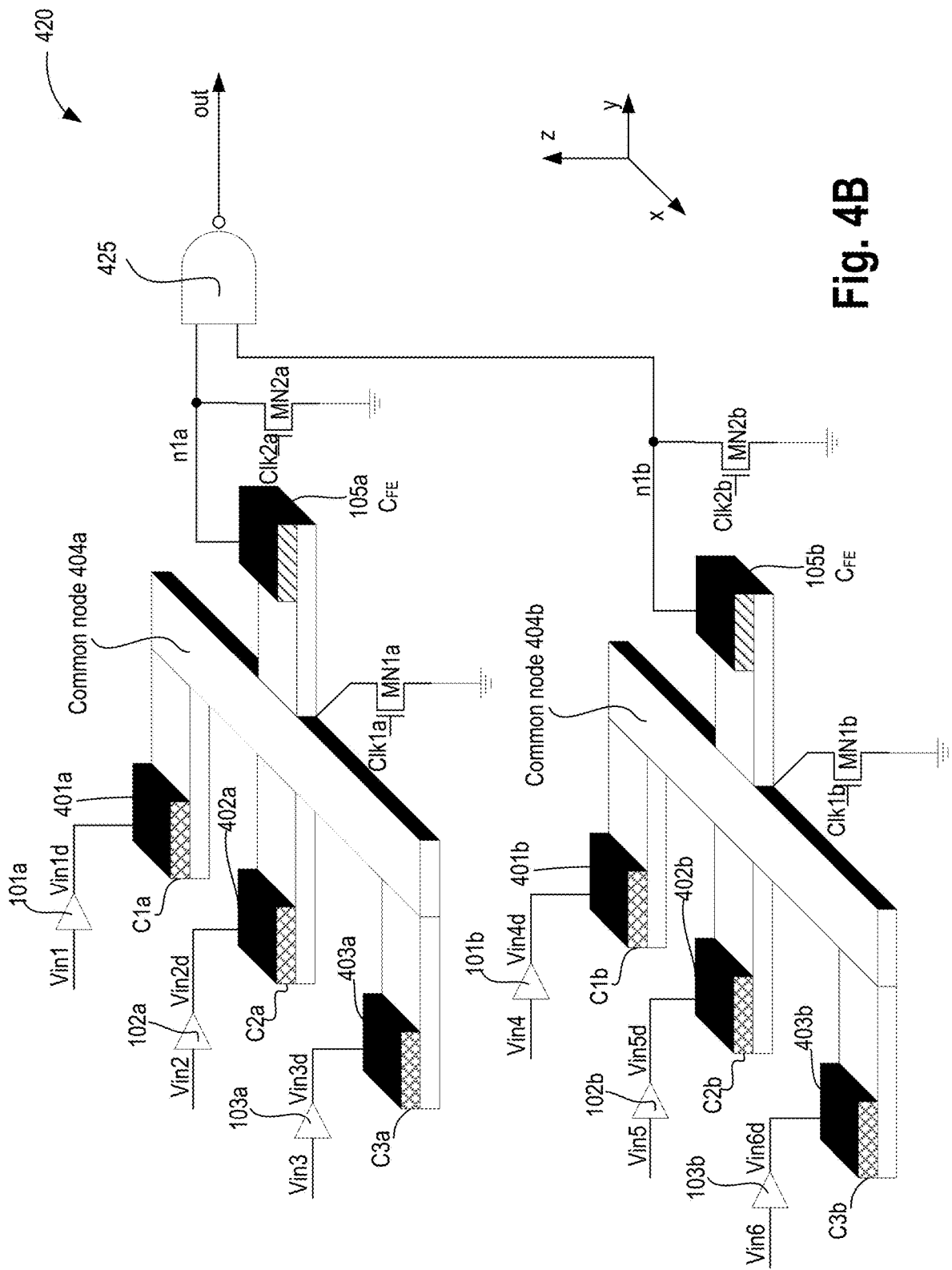
FIG. 4B illustrates combinational logic including the logic gate of FIG. 1B with a 3D view of two 3-input majority gates that couple to an input of a 2-input NAND gate, in accordance with some embodiments.

FIG. 4B illustrates combinational logic 420 having logic gate of FIG. 1B with a 3D view of two 3-input majority gates that couple to an input of a 2-input NAND gate, in accordance with some embodiments. In this example, two majority gates provide inputs to NAND gate 425. The first majority gate comprises capacitors C1a (401a), C2a (402a), and C3a (403a) coupled to node 401a, and capacitor 105a coupled to node 404a and node n1a. Node n1a is coupled to the first input of NAND gate 425. Inputs to capacitors C1a (401a), C2a (402a), and C3a (403a) may come from same drivers or different drivers. Input to drivers 101a, 102a, and 103a are Vin1, Vin2, and Vin3, respectively. The output of drivers 101a, 102a, and 103a are Vin1d, Vin2d, and Vin3d, respectively. Transistors MN1a and MN2a pre-discharge nodes 404a and n1a. As described herein, one transistor can be used to pre-discharge nodes 401a and n1a instead of two transistors. In some embodiments, transistors MN1a and MN1a are controlled by Clk1a and Clk2a, respectively. Here, Clk2a can be same as Clk1a or different. For example, Clk2a is phase shifted relative to Clk1a. Capacitor 105a is a non-linear polar capacitor, which may comprises one of: ferroelectric material, para-electric material, and non-linear dielectric.

The second majority gate comprises capacitors C1b (401b), C2b (402b), and C3b (403b) coupled to node 401b, and capacitor 105b coupled to node 404b and node n1b. Node n1b is coupled to the second input of NAND gate 425. Inputs to capacitors C1b (401b), C2a (402b), and C3a (403b) may come from same drivers or different drivers. Input to drivers 101b, 102b, and 103b are Vin4, Vin5, and Vin6, respectively. The output of drivers 101b, 102b, and 103b are Vin4d, Vin5d, and Vin6d, respectively. Transistors MN1b and MN2b pre-discharge nodes 404b and n1b. As described herein, one transistor can be used to pre-discharge nodes 401b and n1b instead of two transistors. In some embodiments, the transistors MN1b and MN1b are controlled by Clk1b and Clk2b, respectively. Here, Clk2b can be same as Clk1b or different. For example, Clk2b is phase shifted relative to Clk1b. Capacitor 105b is a non-linear polar capacitor, which may comprises one of: ferroelectric material, para-electric material, and non-linear dielectric.

In some embodiments, transistors for pre-charging or discharging nodes 404a, 404b, n1a, and n1b are shared between the majority gates. In some embodiments, one transistor pre-charging or discharging nodes 404a, 404b, n1a, and n1b are shared between the majority gates. As such, further layout and power reduction is achieved. While each capacitor is shown associated with an independent driver, one driver can drive multiple capacitors of the same or different majority gates.

Figure 4C:
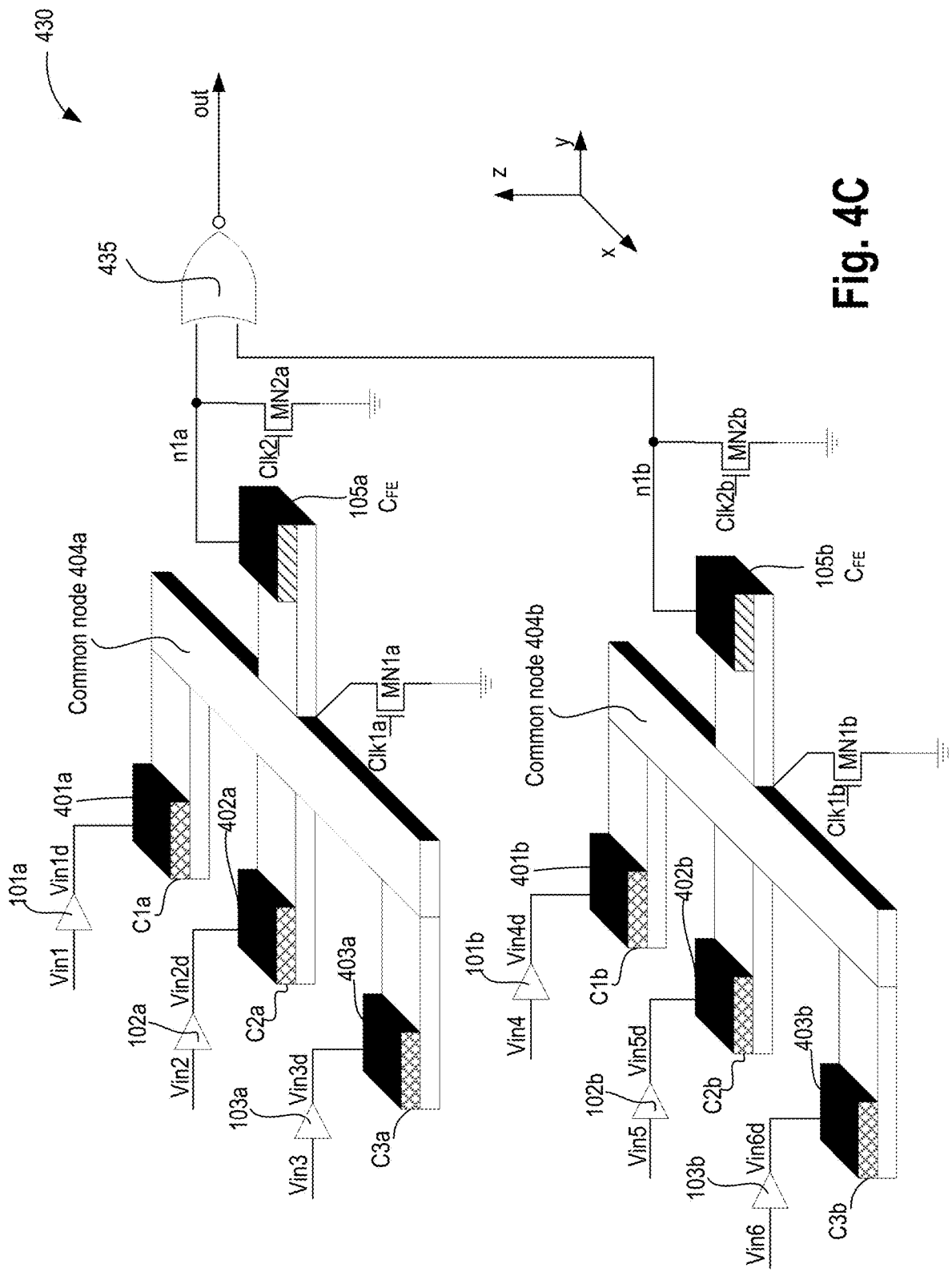
FIG. 4C illustrates combinational logic including the logic gate of FIG. 1B with a 3D view of two 3-input majority gates that couple to an input of a 2-input NOR gate, in accordance with some embodiments.

FIG. 4C illustrates combinational logic 430 having logic gate of FIG. 1B with a 3D view of two 3-input majority gates that couple to an input of a 2-input NOR gate, in accordance with some embodiments. Logic gate 430 is similar to logic gate 420 but for replacing the NAND gate 425 with NOR gate 435. Other logic gates instead of NOR gate 435 can be used. For example, XOR gate, XNOR gate, or any other suitable gate can be used for driving the outputs n1a and n1b.

Figure 4D:
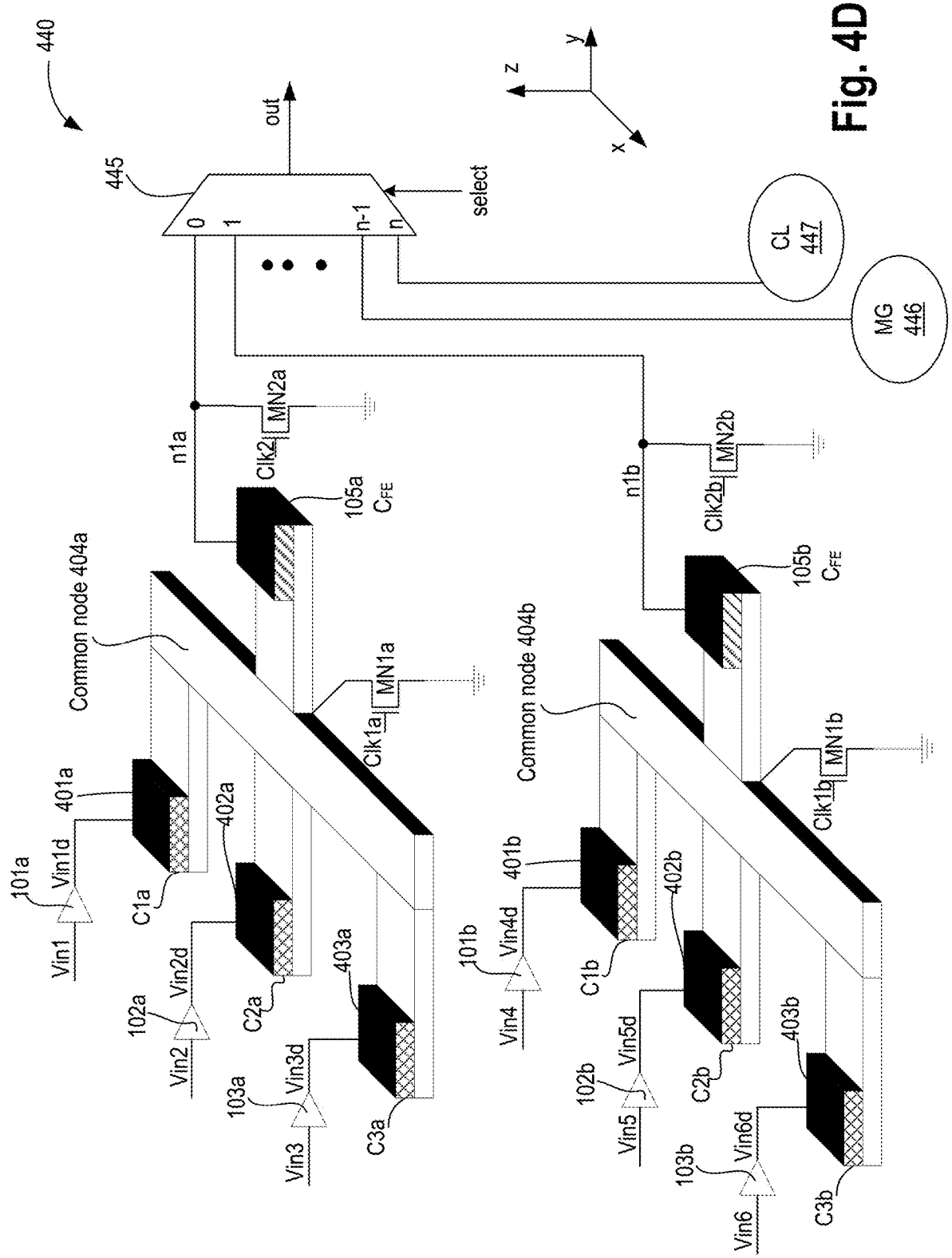
FIG. 4D illustrates combinational logic including the logic gate of FIG. 1B with a 3D view of multiple 3-input majority gates and regular logic gates that couple to inputs of a multi-input multiplexer, in accordance with some embodiments.

FIG. 4D illustrates combinational logic 440 having logic gate of FIG. 1B with a 3D view of multiple 3-input majority gates and regular logic gates that couple to inputs of a multi-input multiplexer, in accordance with some embodiments. Compared to FIG. 4A, here the output driver is a n:1 multiplexer 445. The inputs of multiplexer 445 are coupled to majority gates described with reference to FIGS. 4A-B, other majority gates (MG) 446, threshold gates, traditional combinational logic (CL) 447. As such, an architecture that mixes different logic technologies can be used together and selectable using the select signal.

Figure 5A:
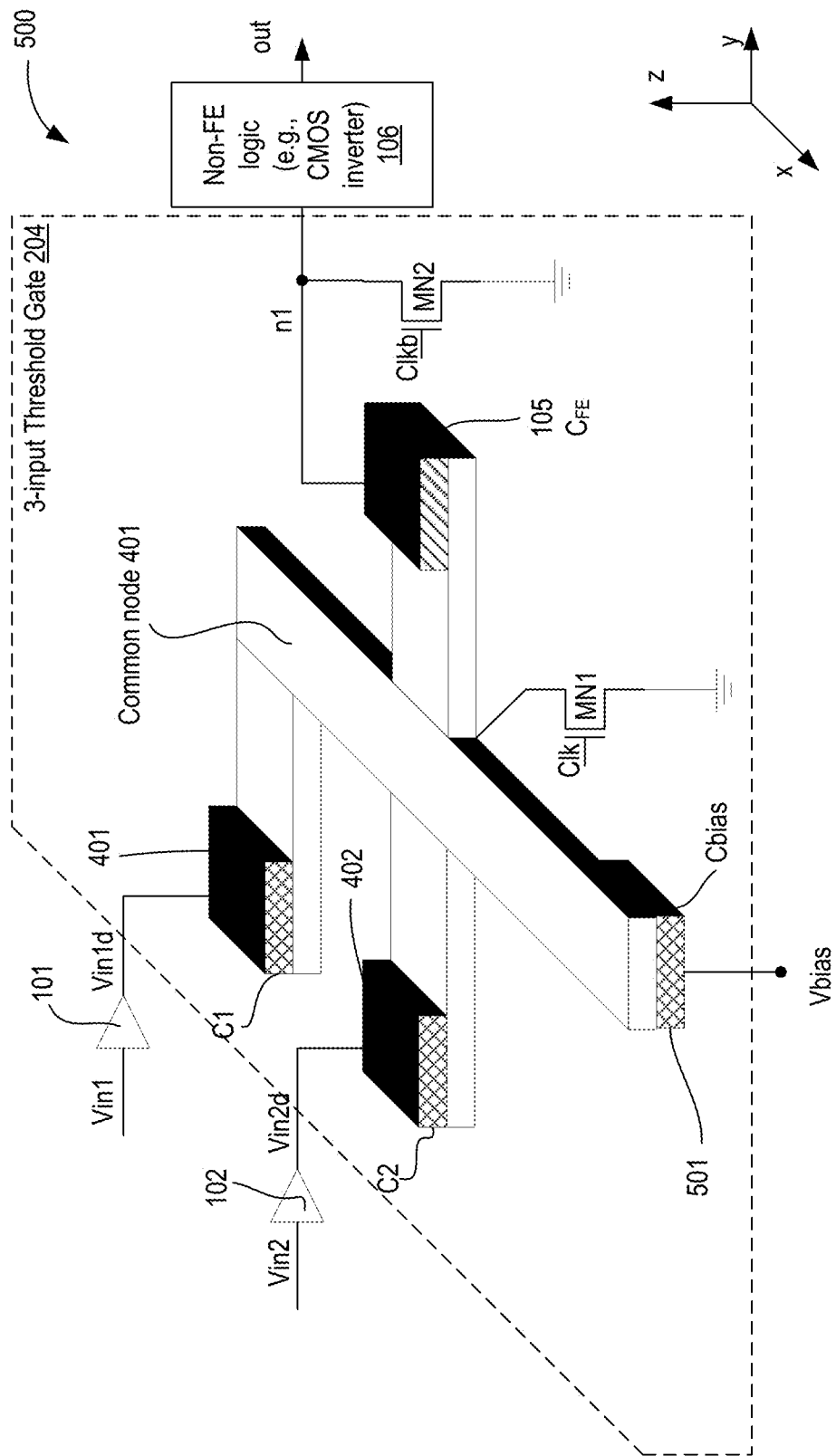
FIG. 5A illustrates combinational logic including the logic gate of FIG. 2A with a 3D view of the 3-input threshold gate that couples to an inverter or buffer, in accordance with some embodiments.

FIG. 5A illustrates combinational logic 500 having a simplified version of the logic gate of FIG. 2A with a 3D view of the 3-input threshold gate that couples to an inverter or buffer, in accordance with some embodiments. Here, 3-input threshold gate 204 is similar to majority gate of FIG. 4A but for removing capacitor C3 and its associated input and adding an extra capacitor 501 Cbias which is biased by Vbias. Vbias can be positive or negative. The various embodiments described with reference to FIG. 2 and FIG. 4A are applicable here.

Figure 5B:
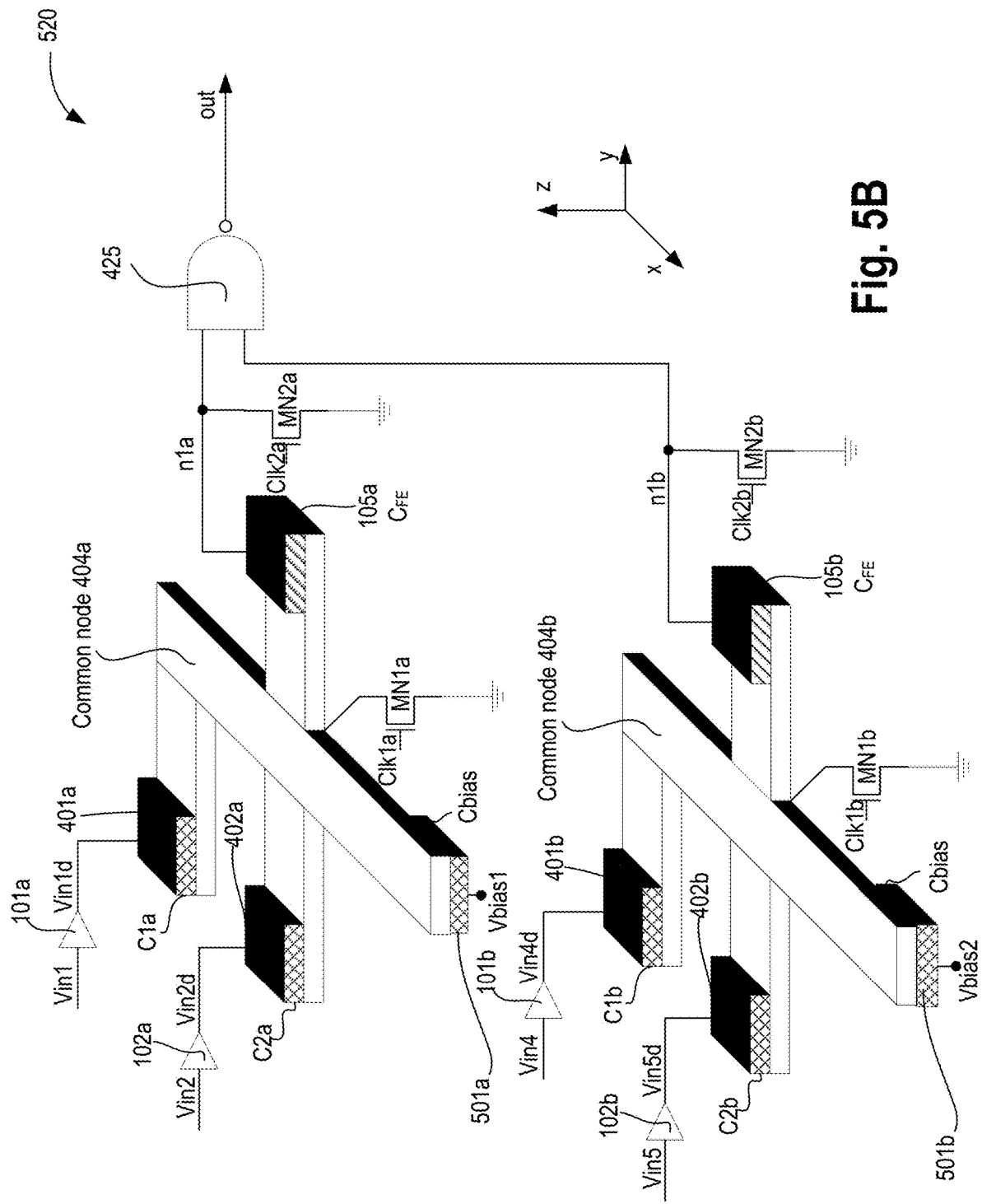
FIG. 5B illustrates combinational logic including the logic gate of FIG. 2A with a 3D view of two 3-input threshold gates that couple to an input of a 2-input NAND gate, in accordance with some embodiments.

FIG. 5B illustrates combinational logic 520 having a simplified version of the logic gate of FIG. 2A with a 3D view of two 3-input threshold gates that couple to an input of a 2-input NAND gate, in accordance with some embodiments. Here, the two 3-input threshold gates of FIG. 4B are replaced with two 3-input threshold gates. Each threshold gate has its associated capacitor 501. For example, the first threshold gate has capacitor 501a coupled to Vbias1, while the second threshold gate has capacitor 501b coupled to Vbias2. Vbias1 and Vbias2 can be the same or different values depending on the desired logic. The various embodiments described with reference to FIG. 2A and FIG. 4B are applicable here.

Figure 5C:
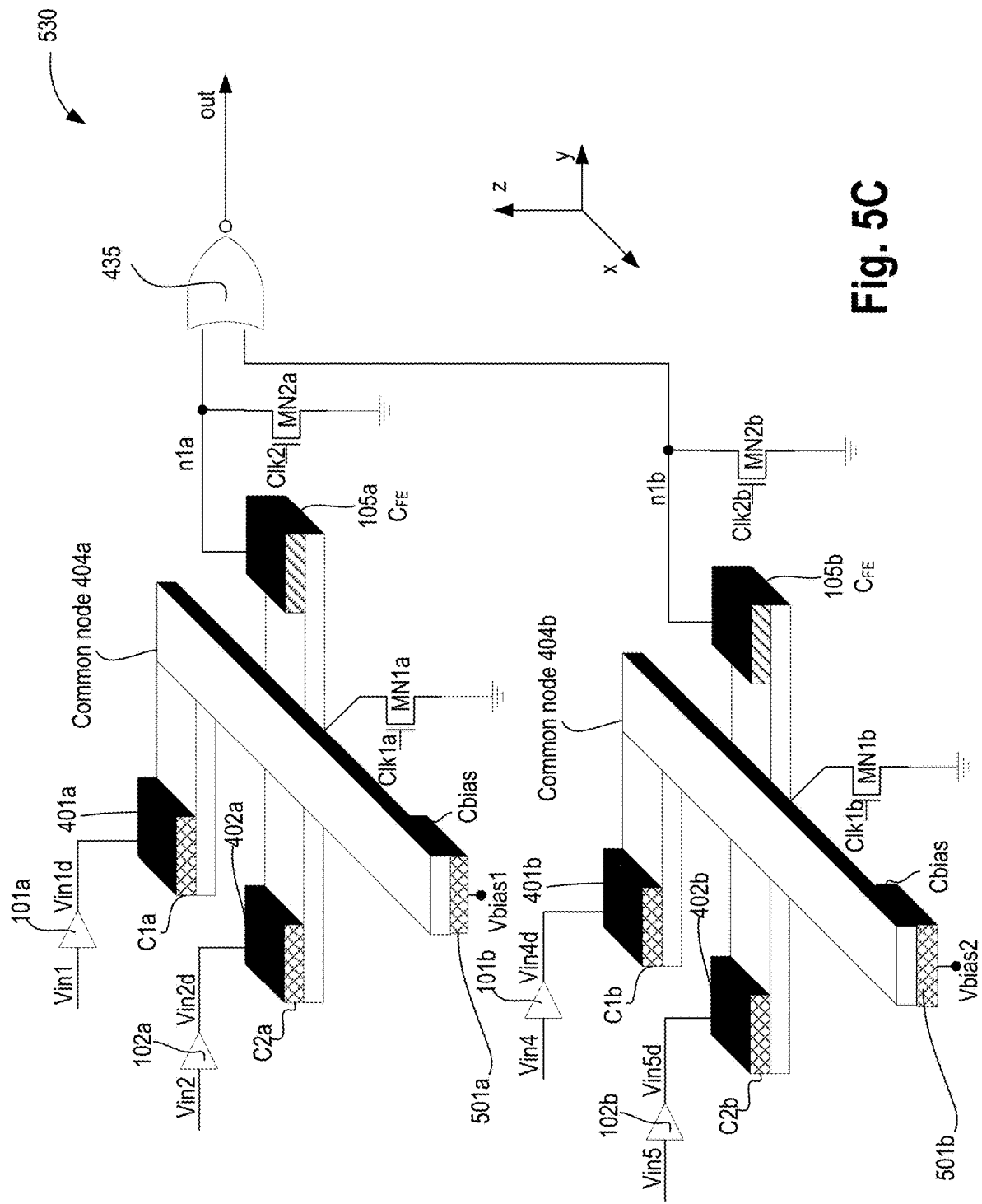
FIG. 5C illustrates combinational logic including the logic gate of FIG. 2A with a 3D view of two 3-input threshold gates that couple to an input of a 2-input NOR gate, in accordance with some embodiments.

FIG. 5C illustrates combinational logic 530 having a simplified version of the logic gate of FIG. 2A with a 3D view of two 3-input threshold gates that couple to an input of a 2-input NOR gate, in accordance with some embodiments. Here, the two 3-input threshold gates of FIG. 4B are replaced with two 3-input threshold gates. Each threshold gate has its associated capacitor 501. For example, the first threshold gate has capacitor 501a coupled to Vbias1, while the second threshold gate has capacitor 501b coupled to Vbias2. Vbias1 and Vbias2 can be the same or different values depending on the desired logic. The various embodiments described with reference to FIG. 2A and FIG. 4C are applicable here.

Figure 5D:
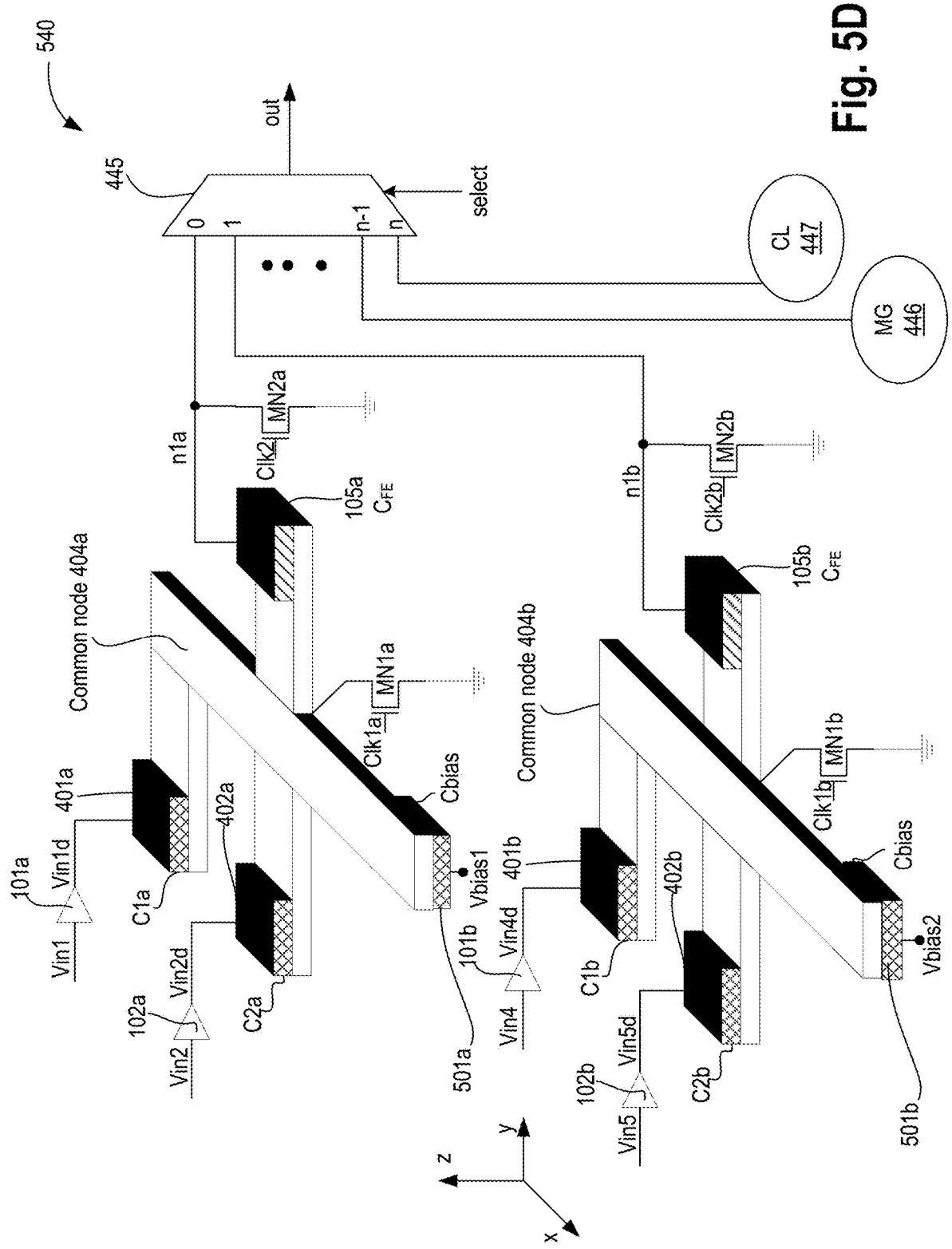
FIG. 5D illustrates combinational logic including the logic gate of FIG. 2A with a 3D view of multiple 3-input threshold gates and regular logic gates that couple to inputs of a multi-input multiplexer, in accordance with some embodiments.

FIG. 5D illustrates combinational logic 540 having a simplified version of the logic gate of FIG. 2B with a 3D view of multiple 3-input threshold gates and regular logic gates that couple to inputs of a multi-input multiplexer, in accordance with some embodiments. Compared to FIG. 5A, here the output driver is a n:1 multiplexer 445. The inputs of multiplexer 445 are coupled to threshold gates described with reference to FIGS. 5A-B, other majority gates (MG) 446, threshold gates, traditional combinational logic (CL) 447. As such, an architecture that mixes different logic technologies can be used together and selectable using the select signal.

Figure 6A:
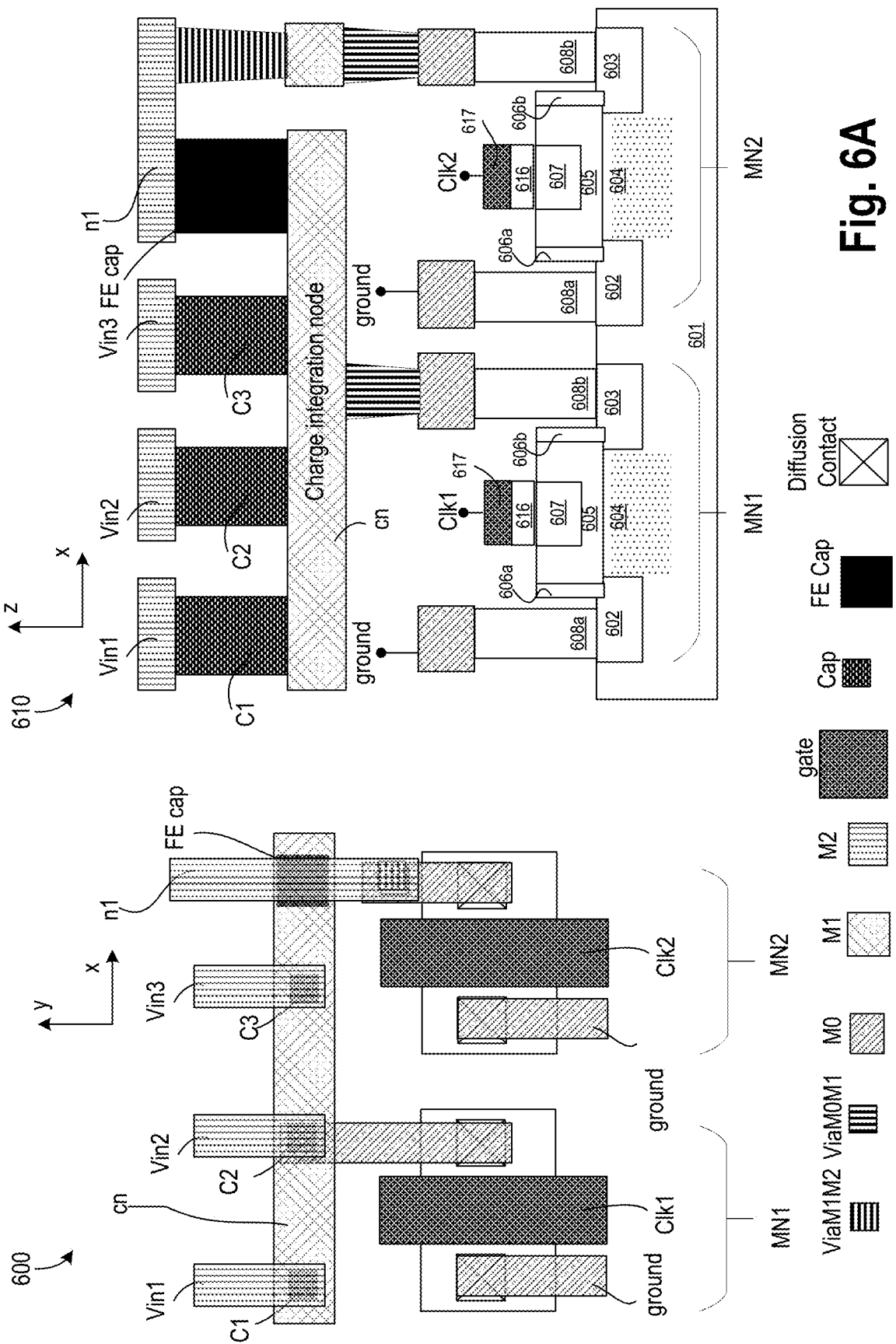
FIG. 6A illustrates top down layout and corresponding cross-section of a 3-input majority gate, respectively, in accordance with some embodiments.

FIG. 6A illustrates top-down layout 600 and corresponding cross-section 610 of a 3-input majority gate, respectively, in accordance with some embodiments. Layout 600 illustrates a compact layout of 3-input majority gate with a pitch of two minimum sized transistors MN1 and MN2. In some embodiments, Non-ferroelectric capacitors C1, C2, and C3, and non-linear polar capacitor (FE cap) are positioned in the same set of layers. For example. non-ferroelectric capacitors C1, C2, and C3, and non-linear polar capacitor (FE cap) are positioned in the place of via for metal layer 1 (M1) to metal layer 2 (M2).

In some embodiments, Non-ferroelectric capacitors C1, C2, and C3, and non-linear polar capacitor (FE cap) are positioned in different set of layers. For example, FE cap is formed above or below capacitors C1, C2, and C3.

Transistors M1 and M2 are in the frontend of the die. Inputs Vin1, Vin2, and Vin3 are on M2. Common node cn (also referred to as charge integration layer or node) is on M1 while node n1 is on M2. The charge node cn can be shared by linear capacitors (C1, C2, C3) and/or non-linear polar capacitor 104. The charge node cn has one or more transistor coupled to ground or another predetermined voltage node. While non-ferroelectric capacitors C1, C2, and C3, and non-linear polar capacitor (FE cap) are positioned in location of M1-via-M2, then can be further located in the backend of the die. For example, non-ferroelectric capacitors C1, C2, and C3, and non-linear polar capacitor (FE cap) can be positioned in M4-via-M5 or higher. As such, lower metal layers are freed up for routing of other signals.

Transistors MN1 and/or MN2 can be a planar or non-planar transistors. In some embodiments, transistors MN1 and/or MN2 can be formed in the frontend or backend. In some embodiments, MN1 and/or MN2 are stacked transistors. In some embodiments, one or more of non-ferroelectric capacitors C1, C2, and C3, and non-linear polar capacitor (FE cap) are formed in the frontend or backend. While transistors MN1 and MN2 are illustrated as n-type transistors, they can be replaced with p-type transistors. In that case, nodes cn and n1 are pre-charged to a predetermined or programmable voltage. The transistors here can be Square Wire, Rectangular Ribbon Transistors, Gate All Around Cylindrical Transistors, Tunneling FETs (TFET), ferroelectric FETs (FeFETs), bi-polar transistors (BJT), BiCMOS, or other devices implementing transistors functionality, for instance, carbon nanotubes or spintronic devices. In some embodiments, the transistors are typical metal oxide semiconductor (MOS) transistors or their derivative including Tri-Gate and FinFET transistors. While MOSFET have symmetrical source and drain terminals, TFET device has asymmetric source and drain terminals.

Transistors MN1 and MN2 are formed in/on substrate 601, and comprises respective source 602, drain 603, channel region 604, source contact 608a, drain contact 608b, and gate comprising gate dielectric 605, gate liners 606a and 606b; gate metal 607.

Substrate 601 includes a suitable semiconductor material such as: single crystal silicon, polycrystalline silicon and silicon on insulator (SOI). In one embodiment, substrate 101 includes other semiconductor materials such as: Si, Ge, SiGe, or a suitable group III-V or group III-N compound. The substrate 101 may also include semiconductor materials, metals, dopants, and other materials commonly found in semiconductor substrates.

In some embodiments, source region 602 and drain region 603 for each transistor are formed within substrate 601 adjacent to the gate stack of the transistor. The source region 602 and drain region 603 are generally formed using either an etching/deposition process or an implantation/diffusion process.

In the etching/deposition process, substrate 601 may first be etched to form recesses at the locations of the source 602 and drain 603 regions. An epitaxial deposition process may then be carried out to fill the recesses with material that is used to fabricate the source region 602 and drain region 603. In the implantation/diffusion process, dopants such as boron, aluminum, antimony, phosphorous, or arsenic may be ion-implanted into the substrate to form the source region 602 and drain region 603. An annealing process that activates the dopants and causes them to diffuse further into substrate 601 typically follows the ion-implantation process.

In some embodiments, one or more layers of metal and/or metal alloys are used to form the source region 602 and drain region 603. In some embodiments, source region 602 and drain region 603 are formed using one or more alternate semiconductor materials such as germanium or a suitable group III-V compound. In some embodiments, source region 602 and drain region 603 are fabricated using a silicon alloy such as silicon germanium or silicon carbide. In some embodiments, the epitaxially deposited silicon alloy is doped in-situ with dopants such as boron, arsenic, or phosphorous.

The semiconductor material for channel region 604 may have the same material as substrate 601, in accordance with some embodiments. In some embodiments, channel region 604 includes one of: Si, SiGe, Ge, and GaAs.

The gate dielectric layer 605 may include one layer or a stack of layers. The one or more layers may include high-k dielectric material, silicon oxide, and/or silicon dioxide ($SiO_2$). The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide. In some embodiments, when a high-k material is used, an annealing process is used on the gate dielectric layer 605 to improve its quality.

In some embodiments, a pair of liner layers (sidewall liners) 606a/b are formed on opposing sides of the gate stack that bracket the gate stack. The pair of liner layers 606a/b are formed from a material such as: silicon oxynitride, silicon nitride, silicon nitride doped with carbon, or silicon carbide. Processes for forming sidewall liners are well-known in the art and generally include deposition and etching process operations. In some embodiments, a plurality of liner pairs may be used. For example, two pairs, three pairs, or four pairs of sidewall liners may be formed on opposing sides of the gate stack.

Gate metal layer 607 may comprise at least one P-type work-function metal or N-type work-function metal, depending on whether the transistor is to be a p-type or an n-type transistor. Gate metal layer 607 may comprise a stack of two or more metal layers, where one or more metal layers are work-function metal layers and at least one metal layer is a conductive fill layer.

For an n-type transistor, metals that may be used for the gate metal layer 607 include: aluminum carbide, tantalum carbide, zirconium carbide, and hafnium carbide. In some embodiments, metal for gate metal layer 607 for n-type transistor include: aluminum, hafnium, zirconium, titanium, tantalum, and their alloys. An n-type metal layer will enable the formation of an n-type gate metal layer 607 with a work function that is between about 3.9 eV and about 4.2 eV. In some embodiments, metal of layer 607 includes one of: TiN, TiSiN, TaN, Cu, Al, Au, W, TiSiN, or Co. In some embodiments, metal of layer 107 includes one or more of: Ti, N, Si, Ta, Cu, Al, Au, W, or Co.

For a p-type transistor, metals that are used for gate metal layer 607 include, but are not limited to, ruthenium, palladium, platinum, cobalt, nickel, and conductive metal oxides. An example of conductive oxide includes ruthenium oxide. A p-type metal layer will enable the formation of a p-type gate metal layer 607 with a work function that is between about 4.9 eV and about 5.2 eV.

Any suitable material can be used for drain and source contacts 608a/b and via 609a/b. For example, one or more of Ti, N, Si, Ta, Cu, Al, Au, W, or Co can be used for drain and source contacts 608a/b and via 609a/b. The gate electrodes 607 may be connected to Clk1 and CLk2 directly or through vias and metal layers 616 and 617, respectively. Node n1 is connected to another logic. Drivers (not shown) drive signals on nodes Vin1, Vin, and Vin3.

Figure 6B:
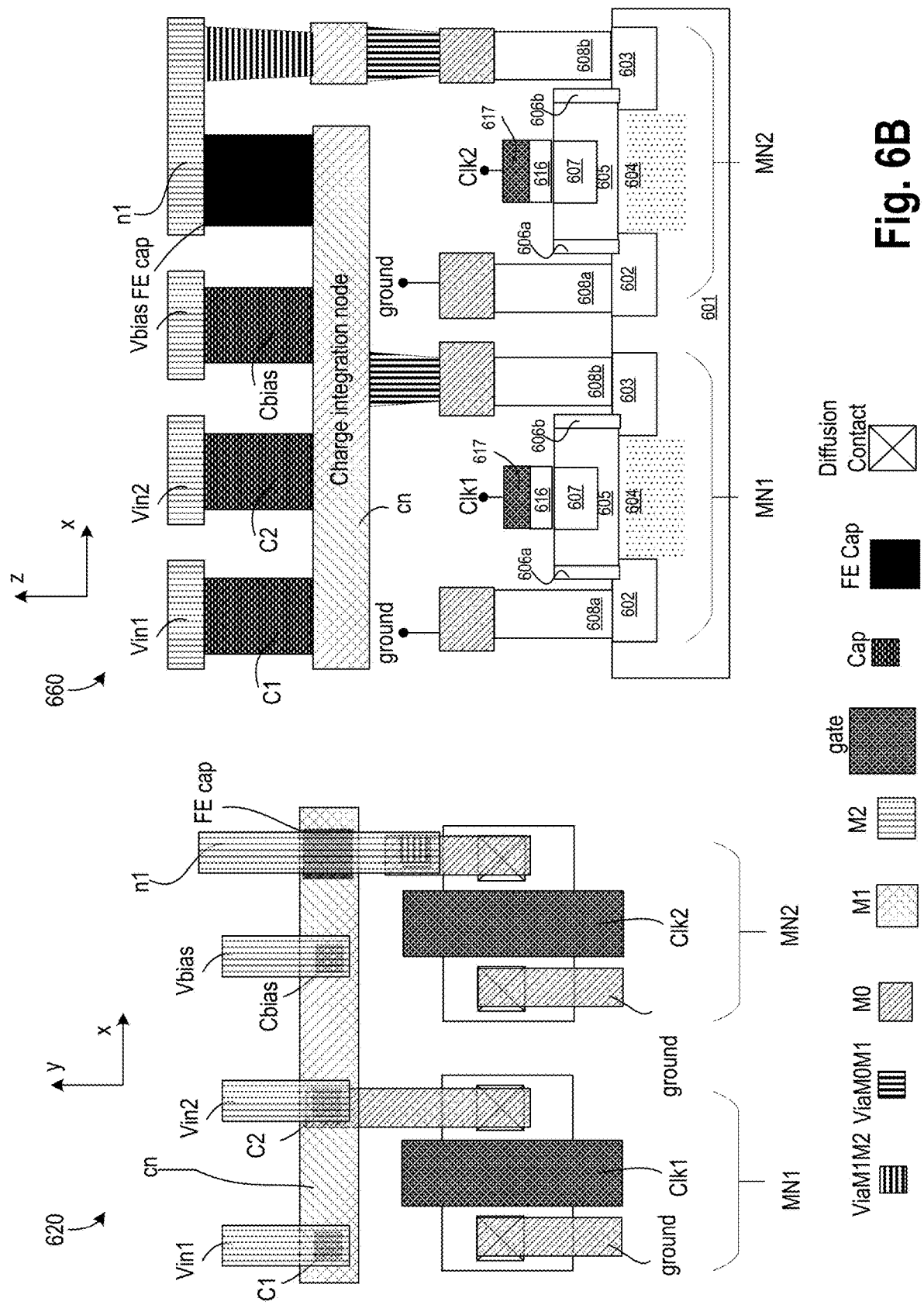
FIG. 6B illustrates top down layout and corresponding cross-section of a 3-input threshold gate, respectively, in accordance with some embodiments.

FIG. 6B illustrate top-down layout 620 and corresponding cross-section 660 of a 3-input threshold gate, respectively, in accordance with some embodiments. FIG. 6B is similar to FIG. 6A but for replacing Vin3 with Vbias and replacing C3 with Cbias.

The cross-sections of FIGS. 6A-B, are fabricated using a sequenced semiconductor metal processing. This process comprises forming gated semiconductor devices for example, FinFET, nanorwire FETs, TFETs, etc. The functional polar material (e.g., C1, C2. C3. FE Cap), linear dielectrics, non-linear dielectrics, FE, para-electrics, are inserted into one of via0, via1, via2, etc. In some embodiments, the functional polar material can be inserted into a layer reserved for a metal interconnect layer. Either plate of the functional polar material is connected to a known voltage node via a clocked or gated transistor. A charge integration node sharing one of the electrode of the capacitors or functional polar materials is formed in a interconnect layer. Vias for polar materials can be placed close to conductive vias in close proximity. This is unlike a traditional memory integration. The close integration of conductive vias with polar material via provides flexibility for logic and circuit design. The formation of the vias is accomplished with a self-aligned backend of line integration, which in some cases uses EUV (extreme ultra violet) lithography. In some embodiments, polar functional material (e.g., non-linear dielectrics, para-electrics, FE) are co-located in the same interconnect layer as the capacitors C1, C2, and C3. In some embodiments, polar functional material (e.g., non-linear dielectrics, para-electrics, FE) are not co-located in the same interconnect layer as the capacitors C1, C2, and C3. The polar material is contacted to the gates of a CMOS (or other technology) logic circuit 106 (e.g., NAND, NOR, buffer, inverter). The FE cap 105 further comprises a material stack with conductive inter-diffusion barrier, template starter, a polar material, and other functional layers. The FE-Cap 105 may use a conductive pedestal and insulating protective sidewalls.

Figure 7:
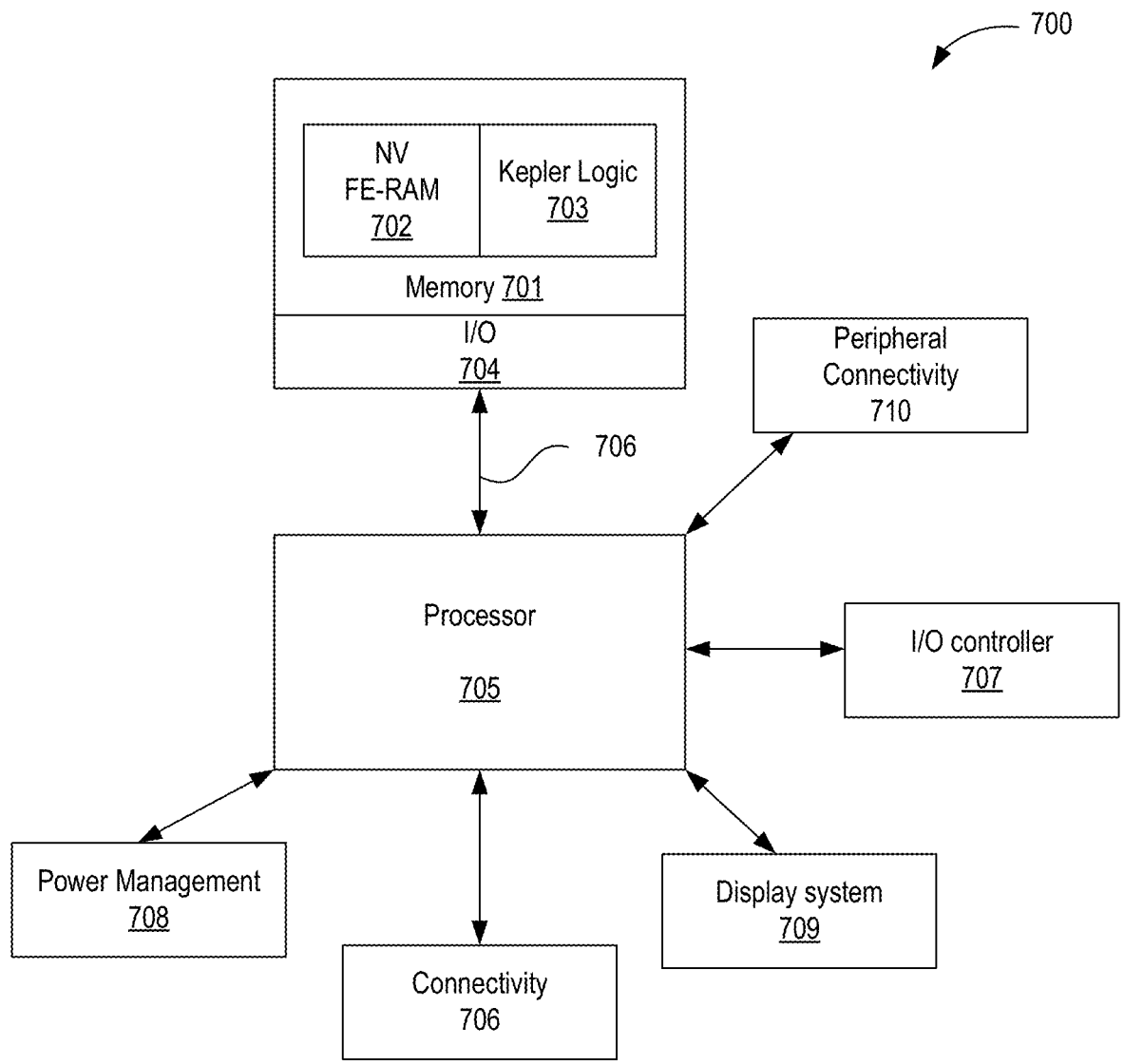
FIG. 7 illustrates a system-on-chip (SOC) that uses the low voltage logic gates, in accordance with some embodiments.

FIG. 7 illustrates system-on-chip (SOC) 700 that uses the low voltage logic gates, in accordance with some embodiments. SOC 700 comprises memory 701 having static random access memory (SRAM) or FE based random access memory FE-RAM, or any other suitable memory. The memory can be non-volatile (NV) or volatile memory. Memory 701 may also comprise logic 703 to control memory 702. For example, write and read drivers are part of logic 703. These drivers and other logic are implemented using the majority or threshold gates of various embodiments. The logic can comprise majority or threshold gates and traditional logic (e.g., CMOS based NAND, NOR etc.).

SOC further comprises a memory I/O (input-output) interface 704. The interface may be double-data rate (DDR) compliant interface or any other suitable interface to communicate with a processor. Processor 705 of SOC 700 can be a single core or multiple core processor. Processor 705 can be a general purpose processor (CPU), a digital signal processor (DSP), or an Application Specific Integrated Circuit (ASIC) processor. In some embodiments, processor 705 is an artificial intelligence (AI) processor (e.g., a dedicated AI processor, a graphics processor configured as an AI processor).

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor 405 has reduced latency of computing the training model and using the training model, which reduces the power consumption of such AI processor systems.

Processor 705 may be coupled to a number of other chip-lets that can be on the same die as SOC 700 or on separate dies. These chip-lets include connectivity circuitry 706, I/O controller 707, power management 708, and display system 709, and peripheral connectivity 710.

Connectivity 706 represents hardware devices and software components for communicating with other devices. Connectivity 706 may support various connectivity circuitries and standards. For example, connectivity 706 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 706 may support non-cellular standards such as WiFi.

I/O controller 707 represents hardware devices and software components related to interaction with a user. I/O controller 707 is operable to manage hardware that is part of an audio subsystem and/or display subsystem. For example, input through a microphone or other audio device can provide input or commands for one or more applications or functions of SOC 700. In some embodiments, I/O controller 707 illustrates a connection point for additional devices that connect to SOC 700 through which a user might interact with the system. For example, devices that can be attached to the SOC 700 might include microphone devices, speaker or stereo systems, video systems or other display devices, keyboard or keypad devices, or other I/O devices for use with specific applications such as card readers or other devices.

Power management 708 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 708 may accordingly put such logic into low power state without the worry of losing data. Power management may select a power state according to Advanced Configuration and Power Interface (ACPI) specification for one or all components of SOC 700.

Display system 709 represents hardware (e.g., display devices) and software (e.g., drivers) components that provide a visual and/or tactile display for a user to interact with the processor 705. In some embodiments, display system 709 includes a touch screen (or touch pad) device that provides both output and input to a user. Display system 709 may includes a display interface, which includes the particular screen or hardware device used to provide a display to a user. In some embodiments, the display interface includes logic separate from processor 705 to perform at least some processing related to the display.

Peripheral connectivity 710 may represent hardware devices and/or software devices for connecting to peripheral devices such as printers, chargers, cameras, etc. Peripheral connectivity 710 say support communication protocols, e.g., PCIe (Peripheral Component Interconnect Express), USB (Universal Serial Bus), Thunderbolt, High Definition Multimedia Interface (HDMI), Firewire, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art).

Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

Example 1: An apparatus comprising: a node; a first capacitor having a first terminal to receive a first input, and a second terminal coupled to the node; a second capacitor having a first terminal to receive a second input, and a second terminal coupled to the node; a third capacitor having a first terminal to receive a third input, and a second terminal coupled to the node; a logic having an input and an output; and a capacitor comprising non-linear polar material, wherein the capacitor includes a first terminal coupled to the node and a second terminal coupled to the input of the logic.

Example 2: The apparatus of example 1, wherein the first, second, and third capacitors are non-ferroelectric capacitors.

Example 3: The apparatus of example 2, wherein the non-ferroelectric capacitors includes one of: a dielectric capacitor, para-electric capacitor, or non-linear dielectric capacitor.

Example 4: The apparatus of example 1 comprises: a first transistor coupled to the node, wherein first transistor is controllable by a first clock; and a second transistor coupled to the input of the logic, wherein the second transistor is controllable by a second clock.

Example 5: The apparatus of example 4, wherein the second clock is different from the first clock.

Example 6: The apparatus of example 4, wherein the second clock is the same as the first clock.

Example 7: The apparatus of example 4, wherein the second clock is an inverse of the first clock.

Example 8: The apparatus of example 1 comprises: a first driver to generate the first input; a second driver to generate the second input; and a third driver to generate the third input.

Example 9: The apparatus of example 5, wherein the first, second, and third drivers comprise CMOS transistors.

Example 10: The apparatus of example 1, wherein the logic comprises one or more of: a buffer, a CMOS inverter, a NAND gate, a NOR gate, a multiplexer.

Example 11: The apparatus of claim 1, wherein the first, second, and third capacitors comprise one of: metal-insulator-metal (MIM) capacitor, transistor gate capacitor, hybrid of metal and transistor capacitor; capacitor comprising para-electric material; non-linear dielectric capacitor, or linear dielectric capacitor.

Example 12: The apparatus of example 1, wherein the non-linear polar material includes one of: ferroelectric material, para-electric material, or non-linear dielectric.

Example 13: The apparatus of example 12, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; a relaxor ferroelectric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides of the form, Hf1−x Ex Oy where E can be Al, Ca, Ce, Dy, er, Gd, Ge, La, Sc, Si, Sr, Sn, Y; Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, Potassium strontium niobate; or improper ferroelectric includes one of: [PTO/STO]n or [LAO/STO]n, where 'n' is between 1 to 100.

Example 14: The apparatus of example 1, wherein the capacitor comprising non-linear polar material is positioned in a backend of a die, and wherein the logic is positioned in a frontend of the die.

Example 15: The apparatus of example 1, wherein the first, second, and third inputs are digital inputs, analog inputs, or a combination of them.

Example 16: An apparatus comprising: first, second, and third drivers to generate first, second, and third digital signals, respectively; first, second, and third non-ferroelectric capacitors to receive the first, second, and third digital signals, respectively; a node to sum charges of the first, second, and third non-ferroelectric capacitors; a ferroelectric capacitor to store the summed charge; and a CMOS logic to drive a voltage of the ferroelectric capacitor.

Example 17: The apparatus of example 16 comprising: a first pull-down device to discharge the node; and a second pull-down device to discharge an input of the CMOS logic.

Example 18: An apparatus comprising: a first circuitry to receive at least three digital signals and apply linear summation to the at least three digital signals, and generate a summed output; and a device to receive the summed output and apply non-linear function via a non-linear polar material, wherein the device to generate a non-linear output compared to the summed output; and a third circuitry to convert the non-linear output to a digital output.

Example 19: The apparatus of example 18, wherein the first circuitry comprises first, second, and third non-ferroelectric capacitors to receive the at least three digital signals, respectively.

Example 20: The apparatus of example 18, wherein non-linear polar material stores the summed output, wherein the non-linear polar material includes one of: ferroelectric material, para-electric material, or non-linear dielectric.

Example 21: The apparatus of example 18, wherein the third circuitry comprises one of: a buffer, an inverter, a NAND gate, or NOR gate, or a multiplexer.

Example 22: A system comprising: a processor; a communication interface communicatively coupled to the processor; and a memory coupled to the processor, wherein the processor comprises a majority gate logic which includes: a node; a first capacitor having a first terminal to receive a first digital input, and a second terminal coupled to the node; a second capacitor having a first terminal to receive a second digital input, and a second terminal coupled to the node; a third capacitor having a first terminal to receive a third digital input, and a second terminal coupled to the node; and a capacitor comprising ferroelectric material, wherein the capacitor includes a first terminal coupled to the node; wherein the processor includes: a logic having an input and an output, wherein the capacitor includes a second terminal coupled to the input of the logic.

Example 23: The system of example 22, wherein the processor is one of an accelerator or an artificial intelligence (AI) processor.

Example 24: The system of example 22 comprising a first Boolean driver to generate the first digital input; a second Boolean driver to generate the second digital input; and a third Boolean driver to generate the third digital input.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a node;
   a first capacitor having a first terminal to receive a first input, and a second terminal coupled to the node;
   a second capacitor having a first terminal to receive a second input, and a second terminal coupled to the node;
   a third capacitor having a first terminal coupled to the node, and a second terminal coupled to a bias voltage, wherein the bias voltage is a non-ground voltage which is either above a ground level or below the ground level, wherein the first capacitor, the second capacitor, and the third capacitor are non-ferroelectric capacitor;
   a logic having an input and an output; and
   a capacitor comprising non-linear polar material, wherein the capacitor includes a first terminal coupled to the node and a second terminal coupled to the input of the logic.

2. The apparatus of claim 1, wherein a number of inputs, including the bias voltage to the apparatus, is odd numbered.

3. The apparatus of claim 1, wherein when the bias voltage is a negative bias voltage, the apparatus operates as a AND logic gate, and wherein when the bias voltage is a positive bias voltage, the apparatus operates as an OR logic gate.

4. The apparatus of claim 1 comprising circuitry to generate the bias voltage, wherein the circuitry includes a voltage divider.

5. The apparatus of claim 1, wherein the bias voltage is programmable or adjustable.

6. The apparatus of claim 1, wherein the non-ferroelectric capacitors include one of: a dielectric capacitor, para-electric capacitor, or non-linear dielectric capacitor.

7. The apparatus of claim 1 comprises:
   a first transistor coupled to the node, wherein first transistor is controllable by a first clock; and
   a second transistor coupled to the input of the logic, wherein the second transistor is controllable by a second clock,
   wherein:
   the second clock is different from the first clock; or
   the second clock is same as the first clock.

8. The apparatus of claim 1 comprises:
   a first driver to generate the first input; and
   a second driver to generate the second input.

9. The apparatus of claim 8, wherein the first and second drivers comprise CMOS transistors, and wherein the logic comprises one of: a CMOS inverter; a NAND gate; a NOR gate; or a multiplexer.

10. The apparatus of claim 1, wherein the first capacitor, the second capacitor, and the third capacitor comprises one of: metal-insulator-metal (MIM) capacitor, transistor gate capacitor, hybrid of metal and transistor capacitor; capacitor comprising para-electric material; non-linear dielectric capacitor, or linear dielectric capacitor.

11. The apparatus of claim 1, wherein the non-linear polar material includes one of: ferroelectric material, para-electric material, or non-linear dielectric.

12. The apparatus of claim 11, wherein the ferroelectric material includes one of:
   Bismuth ferrite (BFO), BFO with a doping material where in the doping material is one of Lanthanum, or elements from lanthanide series of periodic table;
   Lead zirconium titanate (PZT), or PZT with a doping material, wherein the doping material is one of La or Nb;
   a relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
   a perovskite which includes one of: BaTiO3, PbTiO3, KNbO3, or NaTaO3;
   a hexagonal ferroelectric which includes one of: YMnO3 or LuFeO3;
   hexagonal ferroelectrics of a type h-RMnO3, where R is a rare earth element which include one or more of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
   Hafnium (Hf), Zirconium (Zr), Aluminum (Al), Silicon (Si), their oxides or their alloyed oxides;
   Hafnium oxides of a form, Hf1−x Ex Oy where E can be Al, Ca, Ce, Dy, er, Gd, Ge, La, Sc, Si, Sr, Sn, or Y;
   Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction;
   Niobate type compounds LiNbO3, LiTaO3, Lithium iron Tantalum Oxy Fluoride, Barium Strontium Niobate, Sodium Barium Niobate, or Potassium strontium niobate; or
   an improper ferroelectric which includes one of: [PTO/STO]n or [LAO/STO]n, where 'n' is between 1 to 100.

13. The apparatus of claim 1, wherein the first and second are analog signals, digital signals, or a combination of them.

14. The apparatus of claim 1, wherein the capacitor comprising non-linear polar material is positioned in a backend of a die, while transistors of the logic are positioned in a frontend of a die.

15. An apparatus comprising:
   first and second drivers to generate first and second signals, respectively;
   first, second, and third non-ferroelectric capacitors to receive the first signal, second signal, and a negative bias voltage, respectively;

a first node to sum charges of the first, second, and third non-ferroelectric capacitors;

a ferroelectric capacitor to store the summed charge;

a second node coupled to the ferroelectric capacitor, wherein the second node is to provide an AND function of the first and second signals;

a CMOS logic coupled to the second node.

16. The apparatus of claim 15 comprising:

a first pull-down device to discharge the node; and a second pull-down device to discharge an input of the CMOS logic.

17. An apparatus comprising:

a first circuitry to receive at least two signals and apply linear summation to the at least two signals, and generate a summed output;

a second circuitry to provide a programmable or adjustable bias voltage to the summed output, wherein the programmable or adjustable bias voltage is a non-zero voltage;

a device to receive the summed output and apply non-linear function via a non-linear polar material, wherein the device is to generate a non-linear output compared to the summed output; and a third circuitry to convert the non-linear output to a digital output.

18. The apparatus of claim 17, wherein the first circuitry comprises first and second non-ferroelectric capacitors to receive the at least two signals, respectively.

19. The apparatus of claim 17, wherein the second circuitry includes a non-ferroelectric capacitor, which is biased by the bias voltage, wherein when the bias voltage is a negative bias voltage, the apparatus operates as a AND logic gate, and wherein when the bias voltage is a positive bias voltage, the apparatus operates as an OR logic gate.

20. The apparatus of claim 17, wherein the device comprises a capacitor including ferroelectric material to store the summed output, and wherein the third circuitry comprises one of: a buffer, an inverter, a NAND gate, NOR gate, or a multiplexer.

21. A system comprising:

a processor;

a communication interface communicatively coupled to the processor; and a memory coupled to the processor, wherein the processor comprises a majority gate logic which includes:

a node;

a first capacitor having a first terminal to receive a first input, and a second terminal coupled to the node;

a second capacitor having a first terminal to receive a second input, and a second terminal coupled to the node;

a third capacitor having a first terminal coupled to the node, and a second terminal coupled to a programmable or adjustable bias voltage, wherein the first capacitor, the second capacitor, and the third capacitor are non-ferroelectric capacitors;

a logic having an input and an output; and a capacitor comprising ferroelectric material, wherein the capacitor includes a first terminal coupled to the node and a second terminal coupled to the input of the logic, wherein the capacitor includes a second terminal coupled to the input of the logic.

22. The system of claim 21, wherein the processor is one of an accelerator or an artificial intelligence (AI) processor.

23. The system of claim 21, wherein when the bias voltage is a negative bias voltage, the majority gate logic operates as a AND logic gate, and wherein when the bias voltage is a positive bias voltage, the majority gate logic operates as an OR logic gate.

24. The system of claim 21, wherein a number of inputs, including the bias voltage to the majority gate logic, is odd numbered.

* * * * *